(12) United States Patent
Perry

(10) Patent No.: US 7,823,092 B1
(45) Date of Patent: Oct. 26, 2010

(54) METHOD AND APPARATUS FOR IMPLEMENTING A PARAMETERIZABLE FILTER BLOCK WITH AN ELECTRONIC DESIGN AUTOMATION TOOL

(75) Inventor: Steven Perry, High Wycombe (GB)

(73) Assignee: Altera Corporation, San Jose, CA (US)

( * ) Notice: Subject to any disclaimer, the term of this patent is extended or adjusted under 35 U.S.C. 154(b) by 338 days.

(21) Appl. No.: 11/986,607

(22) Filed: Nov. 23, 2007

(51) Int. Cl.
*G06F 17/50* (2006.01)
(52) U.S. Cl. .............................. 716/1; 716/16
(58) Field of Classification Search .............. 716/1, 716/16
See application file for complete search history.

(56) References Cited

U.S. PATENT DOCUMENTS

| | | | |
|---|---|---|---|
| 5,739,691 A * | 4/1998 | Hoenninger, III | 324/322 |
| 5,971,595 A * | 10/1999 | Grant et al. | 716/3 |
| 6,883,147 B1 * | 4/2005 | Ballagh et al. | 716/1 |
| 7,082,591 B2 * | 7/2006 | Carlson | 716/16 |
| 7,139,995 B1 * | 11/2006 | James-Roxby et al. | 716/16 |
| 7,609,297 B2 * | 10/2009 | Master et al. | 348/222.1 |
| 7,610,573 B1 * | 10/2009 | Chan et al. | 716/18 |
| 2006/0176077 A1 * | 8/2006 | Grabill et al. | 326/39 |
| 2007/0043557 A1 * | 2/2007 | Schuller et al. | 704/200.1 |
| 2007/0061342 A1 * | 3/2007 | Magdeburger et al. | 707/100 |

\* cited by examiner

*Primary Examiner*—Thuan Do
*Assistant Examiner*—Magid Y Dimyan
(74) *Attorney, Agent, or Firm*—L. Cho

(57) ABSTRACT

An electric design automation (EDA) tool for generating a design of a system on a field programmable gate array (FPGA) includes a graphical user interface to create a block based schematic. The EDA tool includes a library that includes a parameterizable filter block selectable by a designer to include in the block based schematic to represent a component in the design that filters data. The EDA tool includes a design adjustment unit to automatically modify previously programmed and selected components and wires in the block based schematic without input from the designer upon determining a change made to the parameterizable filter block by the designer.

29 Claims, 21 Drawing Sheets

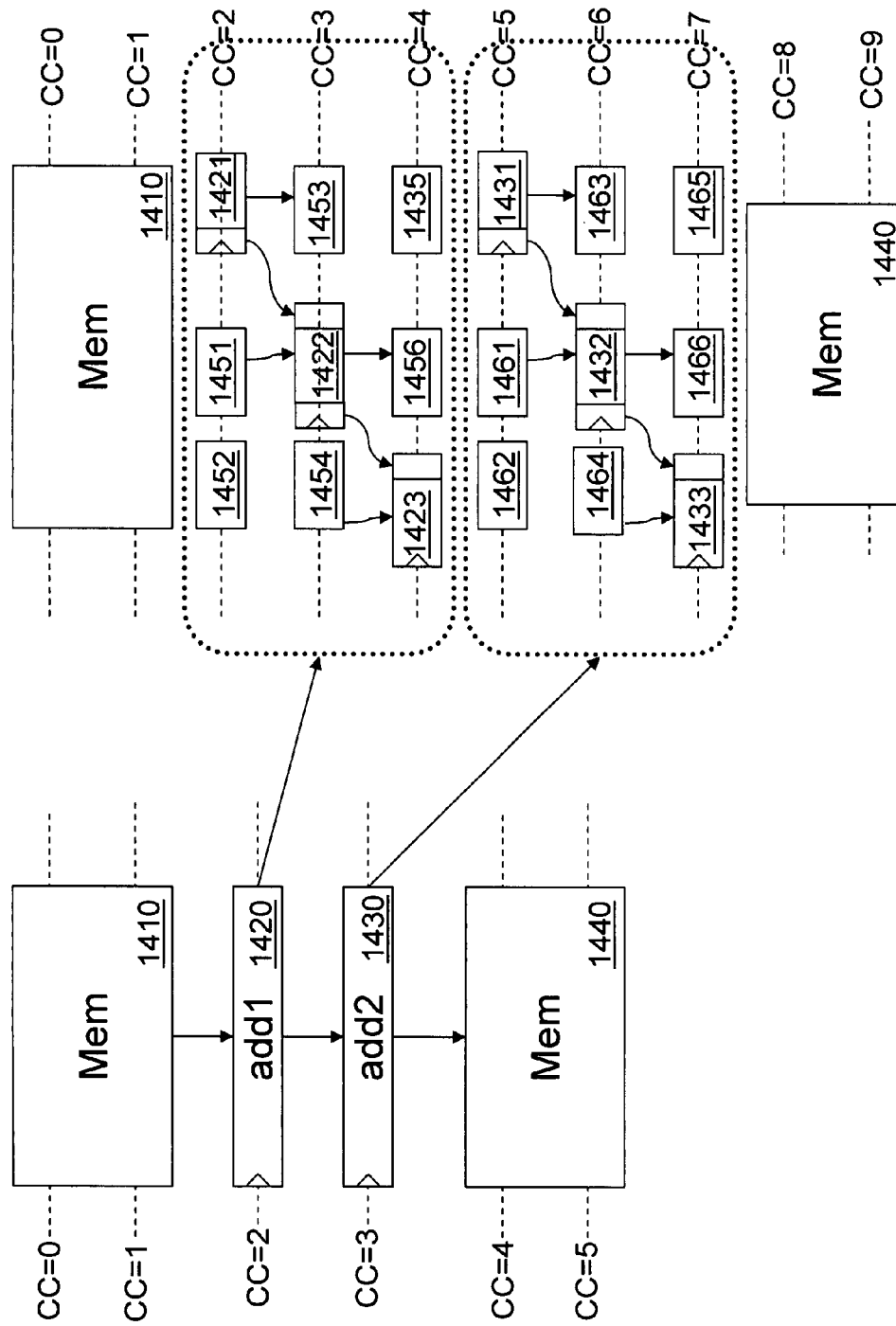

METHOD AND APPARATUS FOR IMPLEMENTING A PARAMETERIZABLE FILTER BLOCK WITH AN ELECTRONIC DESIGN AUTOMATION TOOL

TECHNICAL FIELD

Embodiments of the present invention relate to tools such as electronic design automation (EDA) tools for designing systems on target devices such as field programmable gate arrays (FPGAs). More specifically, embodiments of the present invention relate to a method and apparatus for implementing a parameterizable filter block with an EDA tool.

BACKGROUND

Logic devices such as FPGAs are used to implement large systems that may include million of gates and megabits of embedded memory. The complexity of large systems often requires the use of EDA tools to create and optimize a design for the system onto physical target devices. Among the procedures performed by EDA tools in a computer aided design (CAD) flow are synthesis, mapping, placement, and routing.

Typically during synthesis, a designer inputs a description of the system into the EDA tool. Traditionally, the description of the system includes a register transfer level (RTL) description to describe the operation of synchronous digital circuits. In RTL design, a circuit's behavior is defined in terms of the flow of signals between hardware registers and the logical operations performed on those signals. RTL abstraction is used in hardware description languages such as Verilog and very-high-speed integrated circuit (VHSIC) hardware description language (VHDL) to create high-level representations of a circuit, from which lower-level representations and can be derived.

Many digital signal processing (DSP) circuits are targeted for scalable implementations with varying configurations of channel counts, clock frequencies, and other parameters. When a change is made to one of these aspects of a design to the DSP circuit, many other aspects of the design for the DSP circuit would have to be changed manually to support it. For example, the manual widening of data paths and stepping and repeating of components in the design would require additional time and effort from the designer.

SUMMARY

According to an embodiment of the present invention, an electric design automation (EDA) tool for generating a design of a system on a field programmable gate array (FPGA) is disclosed. The EDA tool includes a graphical user interface to create a block based schematic. The EDA tool includes a library that includes functional units selectable with the graphical user interface to form the block based schematic. The functional blocks include a parameterizable filter blocks selectable by a designer to represent components in the design that filter data. The EDA tool includes a design adjustment unit to automatically modify previously programmed and selected components and wires in the block based schematic without input from the designer upon determining a change made to the parameterizable filter block by the designer. The change made to the parameterizable filter may include a change in interpolation rate, decimation rate, number of channels supported, clock rate, or other parameter. According to one embodiment of the present invention, the design adjustment unit modifies the block based schematic without changing the number of blocks or the number of connections shown in the block based schematic. Instead modifications made by the design adjustment unit to support the change made to the parameterizable filter may be represented with text notation on existing blocks and/or connections.

BRIEF DESCRIPTION OF THE DRAWINGS

The features and advantages of the present invention are illustrated by way of example and are by no means intended to limit the scope of the present invention to the particular embodiments shown.

FIG. 1 illustrates a block diagram of a computer system in which an EDA tool may be implemented on.

FIG. 14a illustrates an exemplary full data path through components on a target device.

FIG. 14b illustrates an exemplary data path pipelined through components on a target device according to a first embodiment of the present invention.

DETAILED DESCRIPTION

In the following description, for purposes of explanation, specific nomenclature is set forth to provide a thorough understanding of embodiments of the present invention. It will be apparent to one skilled in the art that specific details in the description may not be required to practice the embodiments of the present invention. In other instances, well-known circuits, devices, and programs are shown in block diagram form to avoid obscuring embodiments of the present invention unnecessarily.

Figure 1:
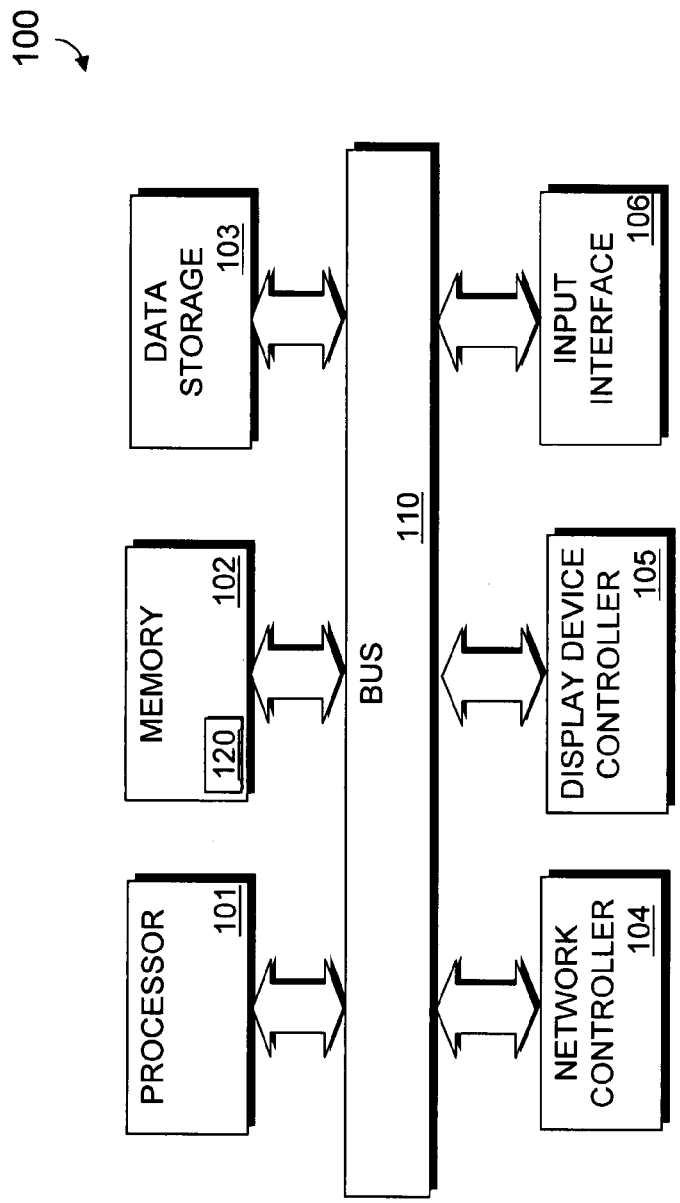

FIG. 1 is a block diagram of an exemplary computer system 100 in which an example embodiment of the present invention resides. The computer system 100 may be used to implement a system designer such as EDA tool. The computer system 100 includes a processor 101 that processes data signals. The processor 101 is coupled to a bus 110 that transmits data signals between components in the computer system 100. The bus 110 may be a single bus or a combination of multiple buses. The computer system 100 includes a memory 102. The memory 102 may be a dynamic random access memory device, a static random access memory device, and/or other memory device. The memory 102 may store instructions and code represented by data signals that may be executed by the processor 101. A data storage device 103 is coupled to the bus 110. The data storage device 103 may be a hard disk drive, a floppy disk drive, a CD-ROM device, a flash memory device or other mass storage device.

A network controller 104 is coupled to the bus 110. The network controller 104 may link the computer system 100 to a network of computers (not shown) and supports communication among the machines. A display device controller 105 is coupled to the bus 110. The display device controller 105 allows coupling of a display device (not shown) to the computer system 100 and acts as an interface between the display device and the computer system 100. An input interface 106 is coupled to the bus 110. The input interface 106 may be, for example, a keyboard and/or mouse controller or other input interface. The input interface 106 allows coupling of an input device to the computer system 100 and transmits data signals from an input device to the computer system 100. It should be appreciated that computer systems having a different architecture or having different components may also be used to implement the computer system 100.

According to an embodiment of the present invention, a system designer 120 may reside in memory 102 and be executed by the processor 101. The system designer 120 may operate to synthesize, map, place and route a system onto a target device. The system designer 120 generates an intermediate representation of a system from a description of the system provided by a designer. A register transfer language (RTL) representation of the system is generated from the intermediate representation of the system. The RTL representation is generated using information regarding unique properties of a target device specified by the designer and specifies how the system is to be implemented on the target device. According to an embodiment of the preset invention, a different RTL representation may be generated from the intermediate representation of the system using information regarding unique properties of a different target device specified by the designer. By performing target specific transformations on an intermediate representation of a system, embodiments of the present invention allow re-targeting a system onto a plurality of devices without requiring a designer to be familiar with all of the properties of the devices. The target specific transformation may include adding delay components to facilitate timing of the system, utilizing unique target specific components to implement. According to an embodiment of the present invention, a bit-accurate, cycle-accurate simulation model is generated from the intermediate representation of the system. The intermediate representation may be used to perform resource estimates. For example, the number of LUTs, multipliers, and memories used by each functional unit may be computed to provide feedback to a designer.

Figure 2:
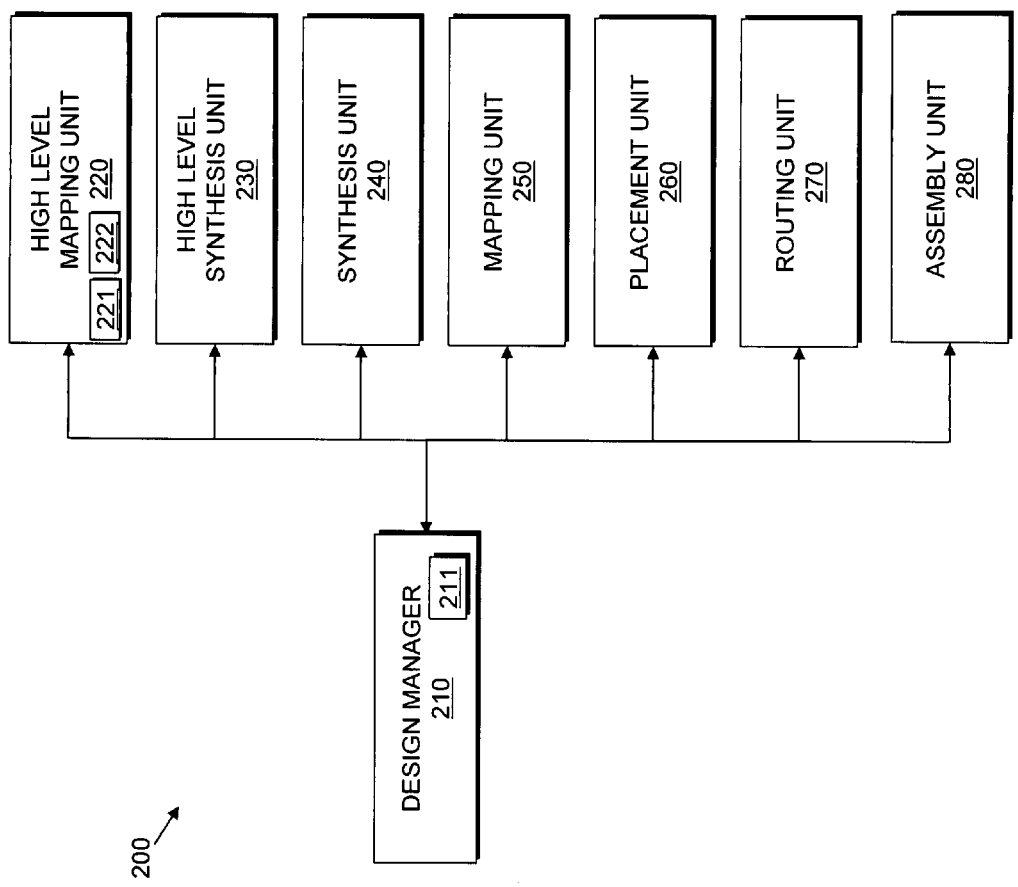
FIG. 2 illustrates a system designer according to an exemplary embodiment of the present invention.

FIG. 2 illustrates a system designer 200 according to an embodiment of the present invention. The system designer 200 may be an EDA tool for designing a system on a target device such as an FPGA or other circuitry. FIG. 2 illustrates modules implementing an embodiment of the system designer 200. According to one embodiment, the modules represent software modules and system design may be performed by a computer system such as the one illustrated in FIG. 1 executing sequences of instructions represented by the modules shown in FIG. 2. Execution of the sequences of instructions causes the computer system to support system design as will be described hereafter. In alternate embodiments, hard-wire circuitry may be used in place of or in combination with software instructions to implement embodiments of present invention. Thus, embodiments of present invention are not limited to any specific combination of hardware circuitry and software.

The system designer 200 includes a designer manager 210. The designer manager 210 is connected to and transmits data between the components of the system designer 200. The designer manager 210 also generates an intermediate representation of the system from a description of the system provided by a designer. The designer may use the designer manager 210 to create a structural netlist using a programming language construct supported by the designer manager 210. Alternatively, the designer may use a graphical user interface unit 211 supported by the designer manager 210 to create a block based schematic that may be converted into a structural netlist. The graphical user interface unit 211 may include a library of functional units that may be selected and connected together to form the block based schematic. The library of functional units may be technology independent and applied to target devices of any architecture. The structural netlist describes the components and connectivity of the system.

The design manager 210 allows the designer to provide a description of the system at a level of detail that does not include pipelined delays that may be implemented by registers or other delay components that allow the system to satisfy timing requirements such as operating at or above a maximum frequency of a clock of the system specified by a designer. Thus, a designer may provide a description of a system that may be applicable to more than one target devices as opposed to a description suited for a specific target device. The structural netlist functions as an intermediate representation of the description of the system. According to an embodiment of the present invention, algorithmic delays may still be provided by a designer. Algorithmic delays may be described as delays which are intrinsic to an operation of an algorithm, such as a delay line in a Finite Infinite Response (FIR) filter, a feed back delay in an Infinite Impulse Response (IIR) filter, or other types of algorithmic delays that are seen in "text book" descriptions of algorithms.

The system designer 200 includes a high level technology mapping unit 220. The high level technology mapping unit 220 receives an identity of a selected or specified target device for which the system is to be implemented on. According to an embodiment of the present invention, the target device is selected or specified by the designer. The target device may be, for example, a specific field programmable gate array (FPGA) manufactured by Altera® Corporation such as APEX™, Stratix™, Cyclone™, Stratix™ II, Cyclone™ II, Stratix™ III, or Cyclone™ III or an FPGA manufactured by Xilinx® Inc. such as Virtex™, Virtex™ II, Virtex IV™, or Virtex V™ or an FPGA having a different architecture. Each target device may have a unique architecture with resources having unique properties and characteristics. The high level technology mapping unit 220 identifies one or more components in the intermediate representation of the description of the system that could be implemented or represented with one or more unique components on the target device where the one of more unique components on the target device is capable of implementing the functionalities of the one or more components in the intermediate representation of the description of the system efficiently.

According to an embodiment of the system designer 200, the high level technology mapping unit 220 identifies an adder (a carry chain). The high level technology mapping unit 220 may include a timing analysis unit 221. The timing analysis unit 221 determines whether a data path through the adder satisfies a timing requirement of the system. If the data path is a critical path and does not satisfy a timing requirement of the system, the timing analysis unit 221 may determine that instead of implementing the adder as a single component that it may be more beneficial to implement the adder with a partitioned adder that utilize a plurality of sub-adders. Partitioning an adder allows intermediate results generated from sub-adders to be registered. This allows the maximum frequency of a clock on the target device may be increased to meet the timing requirement. According to an embodiment of the timing analysis unit 221, timing analysis may be performed to determine how an adder should be partitioned and how many partitions should be made.

The high level technology mapping unit 220 may include a partitioning unit 222 that identifies components on the target device to support and implement the adder as a partitioned adder having a plurality of sub-adders. According to an embodiment of the high level technology mapping unit, the partitioning unit 222 may designate a separate sub-adder for each partition of an adder, a separate memory to input data into each sub-adder, and/or a separate memory to receive data from each sub-adder. Each sub-adder may add together a first portion of two N bit numbers and provide a carry value to the input of a next sub-adder that adds together a second portion of the two N bit numbers. According to an embodiment of the high level technology mapping unit, the number of logic elements used for implementing a partitioned adder is P*N+P, where P is a number of partitions in an adder and N is a number of bits of the adder.

The system designer 200 includes a high level synthesis unit 230. The high level synthesis unit 230 adds pipelined delays onto the intermediate representation of the description of the system. According to an embodiment of the present invention, the pipelined delays are implementation delays that allow the system to satisfy timing requirements such as operating at or above the maximum frequency of a clock in the system specified by a designer. The pipelined delays are added by the high level synthesis unit 230 which takes into consideration the architecture of the target device selected and the properties and characteristics of the resources on the target device that may have been selected at 220. Each target device may have a unique architecture with resources having unique properties and timing that would require a different number or configuration of registers and/or other delay components in the design to make the system operate efficiently. According to an embodiment of the present invention, algorithmic delays may be distributed as part of adding pipelined delays onto the intermediate representation of the description of the system. The high level synthesis unit 230 also generates a register transfer language (RTL) representation of the system from the intermediate representation of the description of the system. The RTL representation may be in a hardware description languages such as Verilog or very-high-speed integrated circuit (VHSIC) hardware description language (VHDL).

The system designer 200 includes a synthesis unit 240 that performs synthesis. The synthesis unit 240 generates a logic design of a system to be implemented on the target device. According to an embodiment of the system designer 200, the synthesis unit 240 takes a conceptual HDL design definition and generates an optimized logical representation of the system. The optimized logical representation of the system generated by the synthesis unit 240 may include a representation that has a minimized number of functional blocks and registers, such as logic gates and logic elements, required for the system. Alternatively, the optimized logical representation of the system generated by the synthesis unit 240 may include a representation that has a reduced depth of logic and that generates a lower signal propagation delay.

The system designer 200 includes a technology mapping unit 250 that performs technology mapping. The technology mapping unit 250 determines how to implement the functional blocks and registers in the optimized logic representation utilizing specific resources such as cells on a target device thus creating an optimized "technology-mapped" netlist. The technology-mapped netlist illustrates how the resources (cells) on the target device are utilized to implement the system. In an embodiment where the target device is an FPGA or PLD, the technology-mapped netlist may include cells such as LABs, registers, memory blocks, DSP blocks, IO elements or other components.

The system designer 200 includes a placement unit 260 that performs placement. The placement unit 260 processes the optimized technology-mapped netlist to produce a placement for each of the functional blocks.

The system designer 200 includes a routing unit 270 that performs routing. The routing unit 270 determines the routing resources on the target device to use to provide interconnection between the components implementing functional blocks and registers of the logic design.

The system designer 200 includes an assembly unit 280 that performs an assembly procedure that creates a data file that includes the design of the system generated by the system designer 200. The data file may be a bit stream that may be used to program the target device. The assembly unit 280 may output the data file so that the data file may be stored or alternatively transmitted to a separate machine used to program the target device. It should be appreciated that the assembly unit 280 may also output the design of the system in other forms such as on a display device or other medium.

Figure 3:
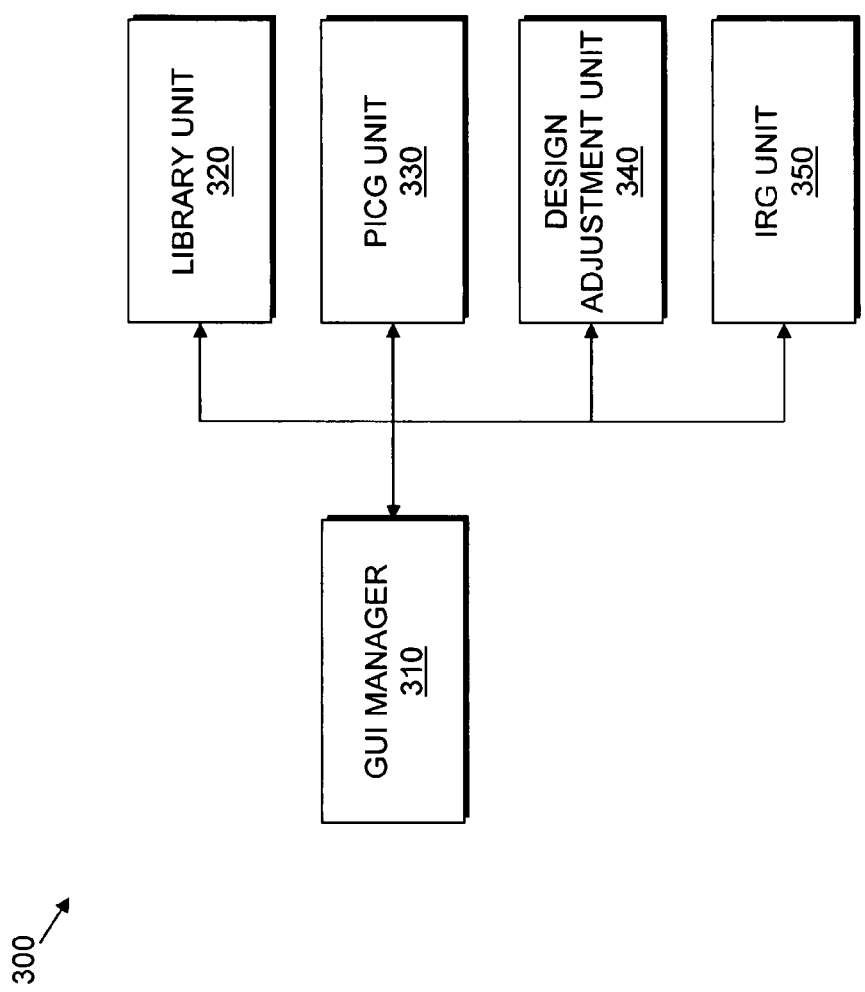
FIG. 3 illustrates a graphical user interface unit according to an exemplary embodiment of the present invention.

FIG. 3 illustrates an exemplary graphical user interface unit 300 according to an embodiment of the present invention. The graphical user interface unit 300 may be used to implement the graphical user interface unit 211 illustrated in FIG. 2. The graphical user interface unit 300 includes a graphical user interface (GUI) manager 310. The GUI manager 310 is connected to and transmits data between the components of the GUI unit 300. The GUI manager 310 provides a graphical user interface to allow a designer to create a block based schematic that may be converted into a structural netlist.

The GUI unit 300 includes a library unit 320. The library unit 320 includes a plurality of functional units that may be selected and connected together to form the block based schematic. The library of functional units may be technology independent and applied to target devices of any architecture. According to an embodiment of the present invention, the library unit 320 includes a processor interface block that may be selected to be included in a block based schematic. The processor interface block represents a component in the system that is assessed by the processor. According to an embodiment of the present invention, the processor interface block may include one or more registers that is written to by a processor that either resides on a target device or outside the target device and that is read by components on the target device. The processor interface block may also include one or more registers that are written to by a component on the target device and that is read by a processor that either resides on the target device or outside the target device.

The GUI unit 300 includes a processor interface circuitry generator (PICG) 330. The processor interface circuitry generator 330 automatically generates circuitry in the design to support the processor interface block without additional input from the designer. The circuitry generated may include one or more registers to store data from the processor, an address decoder to identify a matching address generated by a processor, a write circuit to enable data to be written into the one or more registers when the matching address is identified and a write signal is generated by the processor, a data selector to select data stored in the one or more registers when an address corresponding to the one or more registers is generated by the processor. The circuitry generated may alternatively include one or more registers to store data generated by a component in the system, an address decoder to identify a matching address generated by the processor, and a data selector to select data stored in the one or more registers when an address corresponding to the one or more registers is generated by the processor. The circuitry generated may be represented in part with the processor interface block. Thus, portions of the circuitry generated may be transparent to the designer.

According to an embodiment of the present invention, the library unit 320 may include a parameterizable filter block selectable by a designer to include in the block based schematic to represent a component in the design that filters data. The component may be, for example, a cascaded integrator-comb (CIC) filter, a finite infinite response (FIR) filter, or other filter. The component may be implemented as a functional unit or a combination of one or more functional units. The parameterizable filter block may be programmed to specify an interpolation rate, a decimation rate, a number of channels to support, a clock rate to operate in, and/or other parameters to operate within.

The GUI unit 300 includes a design adjustment unit 340. The design adjustment unit 340 operates to automatically modify previously programmed and selected resources in the block based schematic without input from the designer upon determining a change made to the parameterizable filter block. The modifications made to the previously programmed and selected resources may include modifying previously programmed and selected components and wires so that they support or process a different amount of data.

The GUI unit 300 includes an intermediate representation generator 350 to generate an intermediate representation of the system from a description of the system made up from functional units selected from the library unit 310. According to an embodiment of the present invention, the intermediate representation of the system does not include any pipeline delays.

FIG. 2 illustrates an exemplary block diagram of a system designer 200 and FIG. 3 illustrates an exemplary block diagram of a GUI unit 300. It should be appreciated that addition components may be implemented with the system designer 200 and the GUI unit 300, that not all of the components illustrated are necessary to implement the system designer 200 and GUI unit 300, and that the illustrated components may be substituted with other components.

Figure 4:
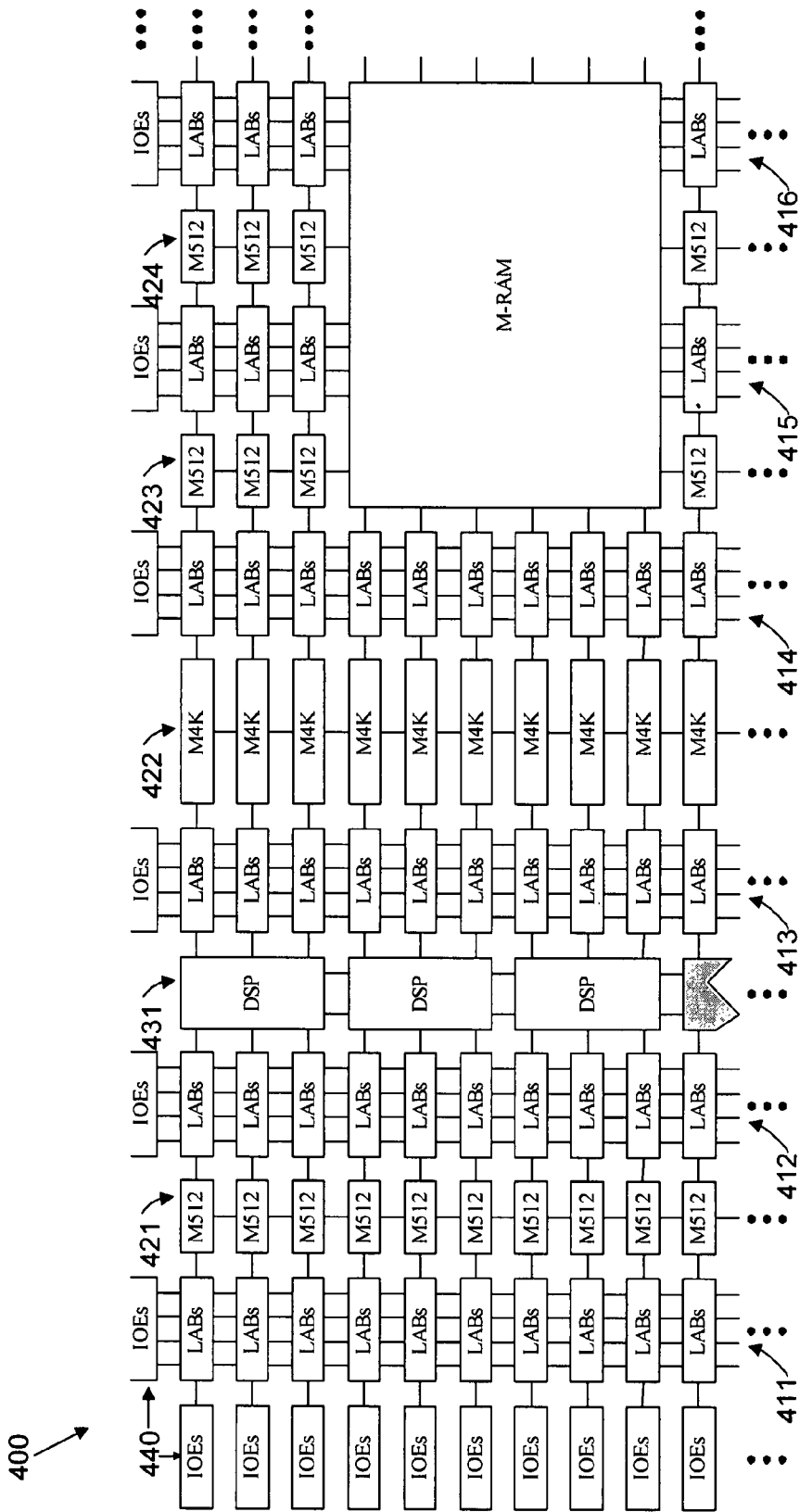
FIG. 4 illustrates an exemplary target device according to an exemplary embodiment of the present invention.

FIG. 4 illustrates an exemplary target device 400 in which a system may be implemented on 400 utilizing an FPGA according to an embodiment of the present invention. According to one embodiment, the target device 400 is a chip having a hierarchical structure that may take advantage of wiring locality properties of circuits formed therein.

The target device 400 includes a plurality of logic-array blocks (LABs). Each LAB may be formed from a plurality of logic blocks, carry chains, LAB control signals, look up table (LUT) chain, and register chain connection lines. A logic block is a small unit of logic providing efficient implementation of user logic functions. A logic block includes one or more combinational cells, where each combinational cell has a single output, and registers. According to one embodiment of the present invention, the logic block may operate similarly to a logic element (LE), such as those found in Stratix™ manufactured by Altera® Corporation, or a combinational logic block (CLB) such as those found in Virtex™ manufactured by Xilinx® Inc. In this embodiment, the logic block may include a four input lookup table (LUT) with a configurable register. According to an alternate embodiment of the present invention, the logic block may operate similarly to an adaptive logic module (ALM), such as those found in Stratix™ II manufactured by Altera® Corporation. LABs are grouped into rows and columns across the target device 400. Columns of LABs are shown as 411-416. It should be appreciated that the logic block may include additional or alternate components.

The target device 400 includes memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the target device in between selected LABs or located individually or in pairs within the target device 400. Columns of memory blocks are shown as 421-424.

The target device 400 includes digital signal processing (DSP) blocks. The DSP blocks may be used to implement multipliers of various configurations with add or subtract features. The DSP blocks include shift registers, multipliers, adders, and accumulators. The DSP blocks may be grouped into columns across the target device 400 and are shown as 431.

The target device 400 includes a plurality of input/output elements (IOEs) 440. Each 10E feeds an I/O pin (not shown) on the target device 400. The IOEs are located at the end of LAB rows and columns around the periphery of the target device 400. Each 10E includes a bidirectional I/O buffer and a plurality of registers for registering input, output, and output-enable signals. When used with dedicated clocks, the registers provide performance and interface support with external memory devices.

The target device 400 may include routing resources such as LAB local interconnect lines, row interconnect lines ("H-type wires"), and column interconnect lines ("V-type wires") (not shown) to route signals between components on the target device.

FIG. 4 illustrates an exemplary embodiment of a target device. It should be appreciated that a system may include a plurality of target devices, such as that illustrated in FIG. 4, cascaded together. It should also be appreciated that the target device may include parameterizable logic devices arranged in a manner different than that on the target device 400. A target device may also include FPGA resources other than those described in reference to the target device 400.

Figure 5:
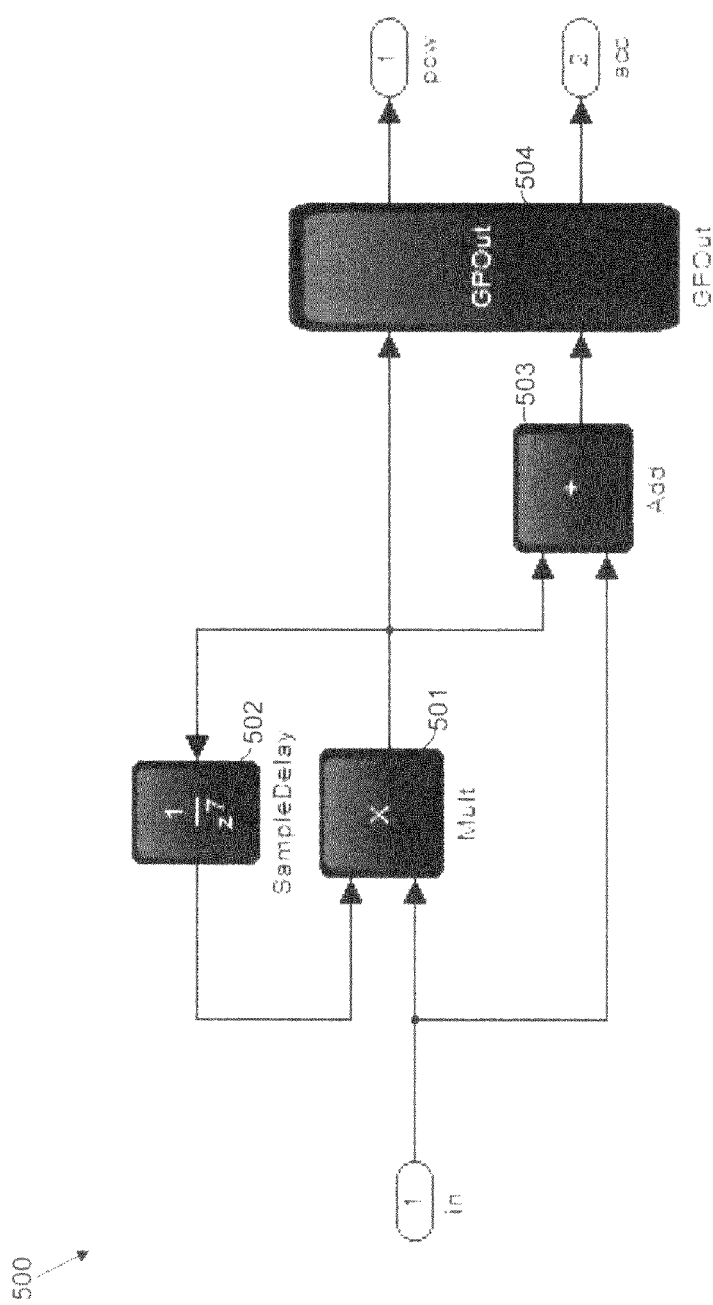
FIG. 5 illustrate a block based schematic according to an exemplary embodiment of the present invention.

FIG. 5 illustrate a block based schematic 500 that describes a portion of a system according to an exemplary embodiment of the present invention. According to an embodiment of the present invention, the block based schematic 500 may be created using a graphical user interface unit such as the one illustrated in FIG. 3. Each of the blocks illustrated represents a functional unit that may be selected from a library such as the library unit 320 illustrated in FIG. 3. FIG. 5 illustrates a multiplication block 501, delay block 502, adder block 503, and a general purpose output block 504. It should be noted that the delay block 502 represents a delay associated with the operation of the system and not with a pipelined delay for how the system is to be implemented on a target device to satisfy timing requirements such as the maximum frequency of a clock.

It should be appreciated that other types of functional units may be available in a library. For example, the library may include the following exemplary functional units.

Abs block: Outputs an absolute of an input.

Add block: Outputs the sum of inputs, a+b.

AddSLoad block: Performs the operation of a registered adder with a synchronous load.

And block: Output logical and of input values, a&b.

ArcTangent: Output an arctangent of the input angle in radians.

BitCombine: Output the bit concatenation of the input values.

BitExtract: Output the bits extracted from the input, and recast as the specified datatype, (datatype)(a>>lsb).

Sequence: Outputs a boolean pulse of configurable duration and phase.

Figure 6:
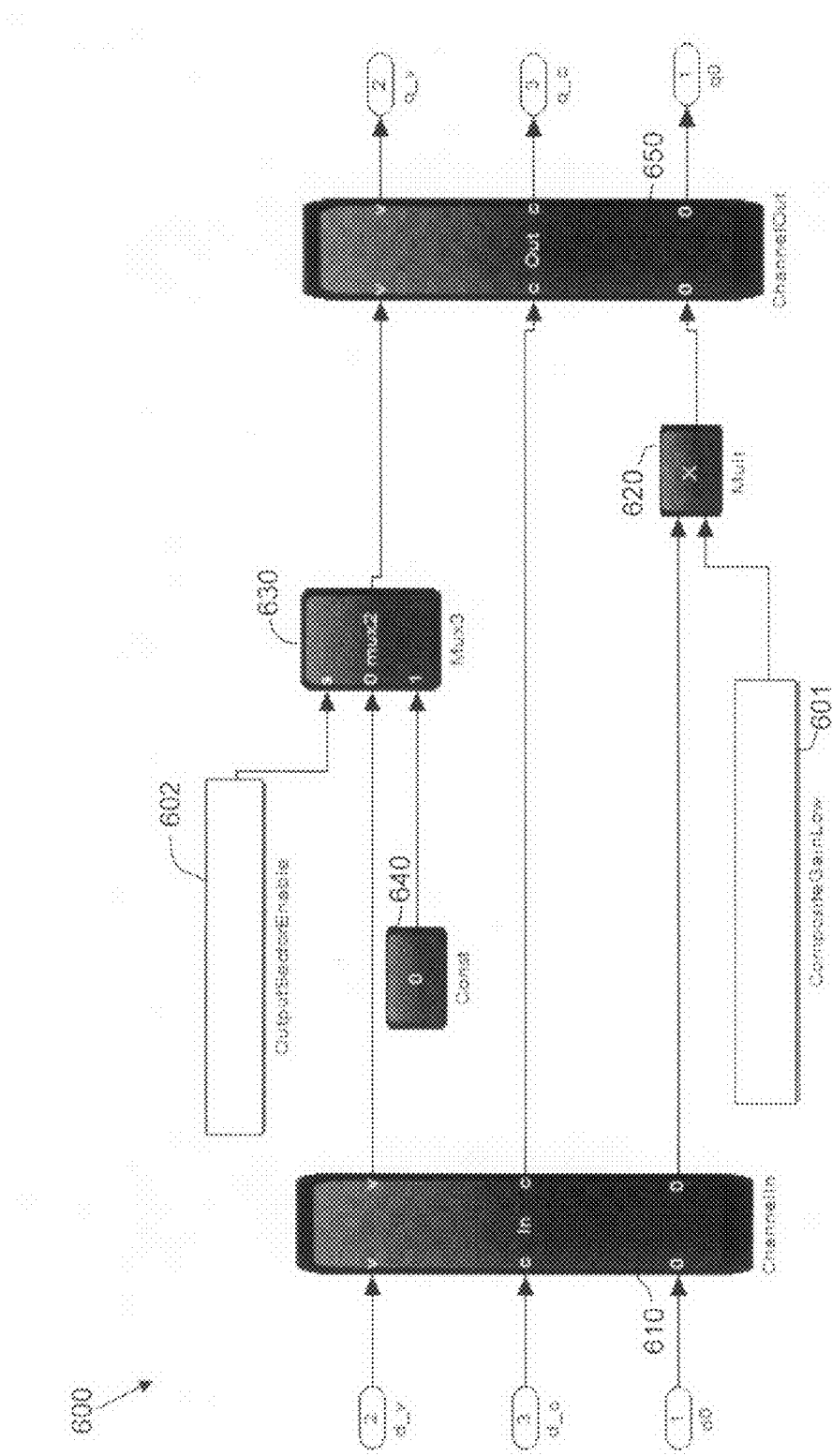
FIG. 6 illustrate a block based schematic that includes a processor interface block according to an exemplary embodiment of the present invention.

FIG. 6 illustrate a block based schematic 600 that includes a first processor interface block 601 and a second processor interface block 602 according to an exemplary embodiment of the present invention. According to an embodiment of the present invention, the block based schematic 600 may be created by using a graphical user interface unit such as the graphical user interface unit 300 illustrated in FIG. 3. The block based schematic 500 includes a ChannelIn block 610 that receives a valid input (d_v) that indicates whether data received is valid, a channel input (d_c) that identifies a channel which data is arriving from, and a data input (d0) that includes the data. The first processor interface block 601 is used to store a value written by a processor. The value is used to apply a gain to the data received by the ChannelIn block 610 though multiplication (Mult) block 620. The second processor interface block 602 is used to store a value written by a processor which selects from a multiplexer (Mux3) block 630 either the valid indicator received from the ChannelIn block 610 or a constant stored in constant (Const) block 640. A ChannelOut block 650 outputs the data with applied gain, the identified channel, and the selected value from multiplexer block 630.

Figure 7:
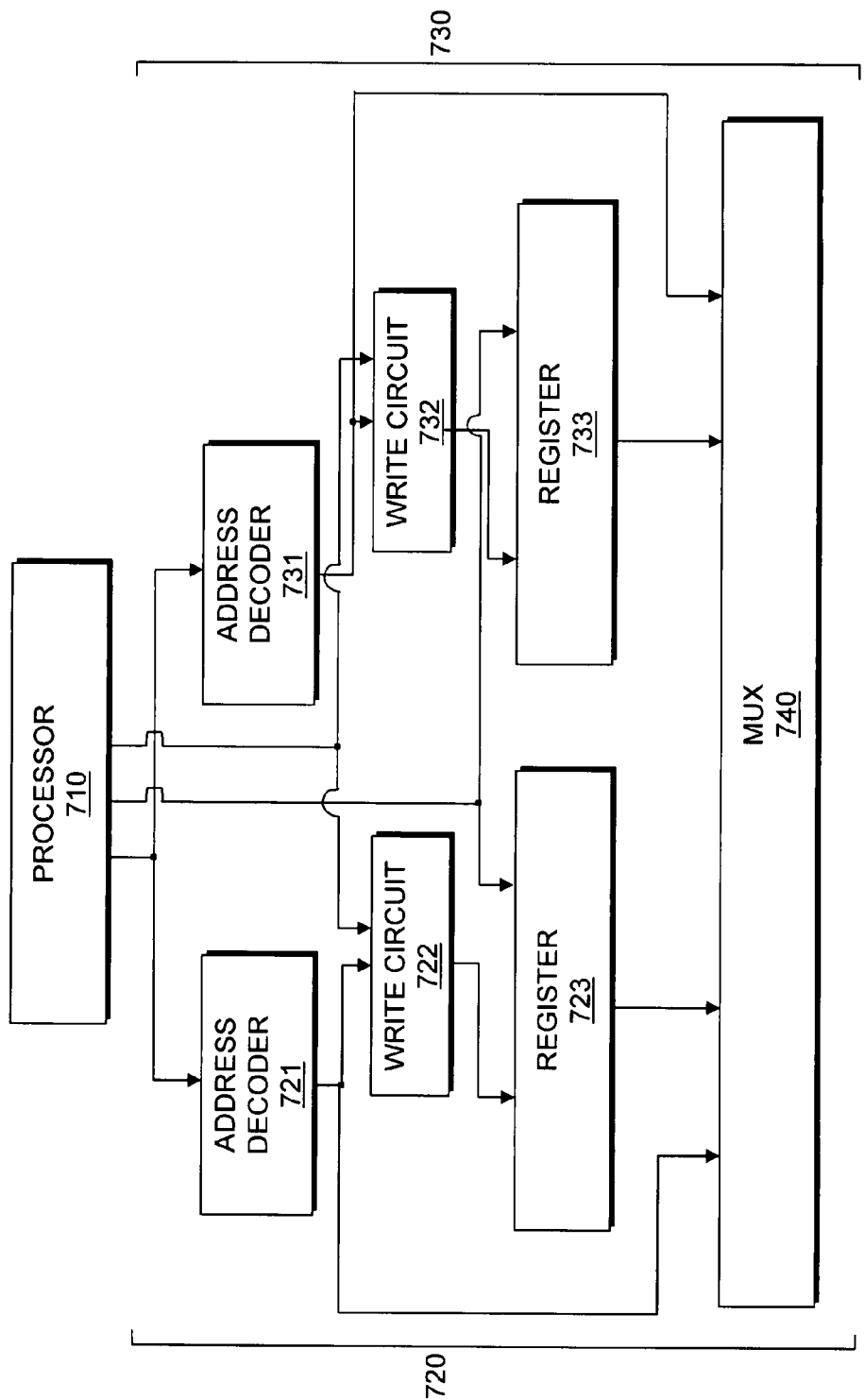
FIG. 7 illustrates circuitry generated for a processor interface block according to a first embodiment of the present invention.

FIG. 7 illustrates circuitry generated for a processor interface block according to a first embodiment of the present invention. A first group of circuitry 720 is generated for a first processor interface block and a second group of circuitry 730 is generated for a second processor interface block. According to an embodiment of the present invention, the circuitry for a processor interface block is generated for a system design when a designer selects a processor interface block from a library unit to include a block based schematic. The circuitry for the first processor interface block 720 and the circuitry for the second processor interface block 730 receive data from processor 710. The circuitry for the first processor interface block 720 includes an address decoder 721 that determines whether an address received from the processor 710 matches an address for its associated register 723. The circuitry for the first processor interface block 720 includes a write circuit 722. When the address decoder 721 determines that the address received from the processor 710 is a matching address and the processor 710 transmits a write signal, the write circuit 722 transmits a write signal to the register 723 that prompts the register 723 to store the data written from the processor 710. The circuitry for the second processor interface block 730 similarly includes an address decoder 731, write circuit 732, and a register 733 which performs similarly to the circuitry for the first processor interface block 720. A data selector (mux) 740 receives a copy of the data from each of the registers 723 and 733 and selects data to be output in response to the address transmitted by the processor 710 in a processor read cycle. In one embodiment, the data output from the data selector 740 may be read by the processor 710.

Figure 8:
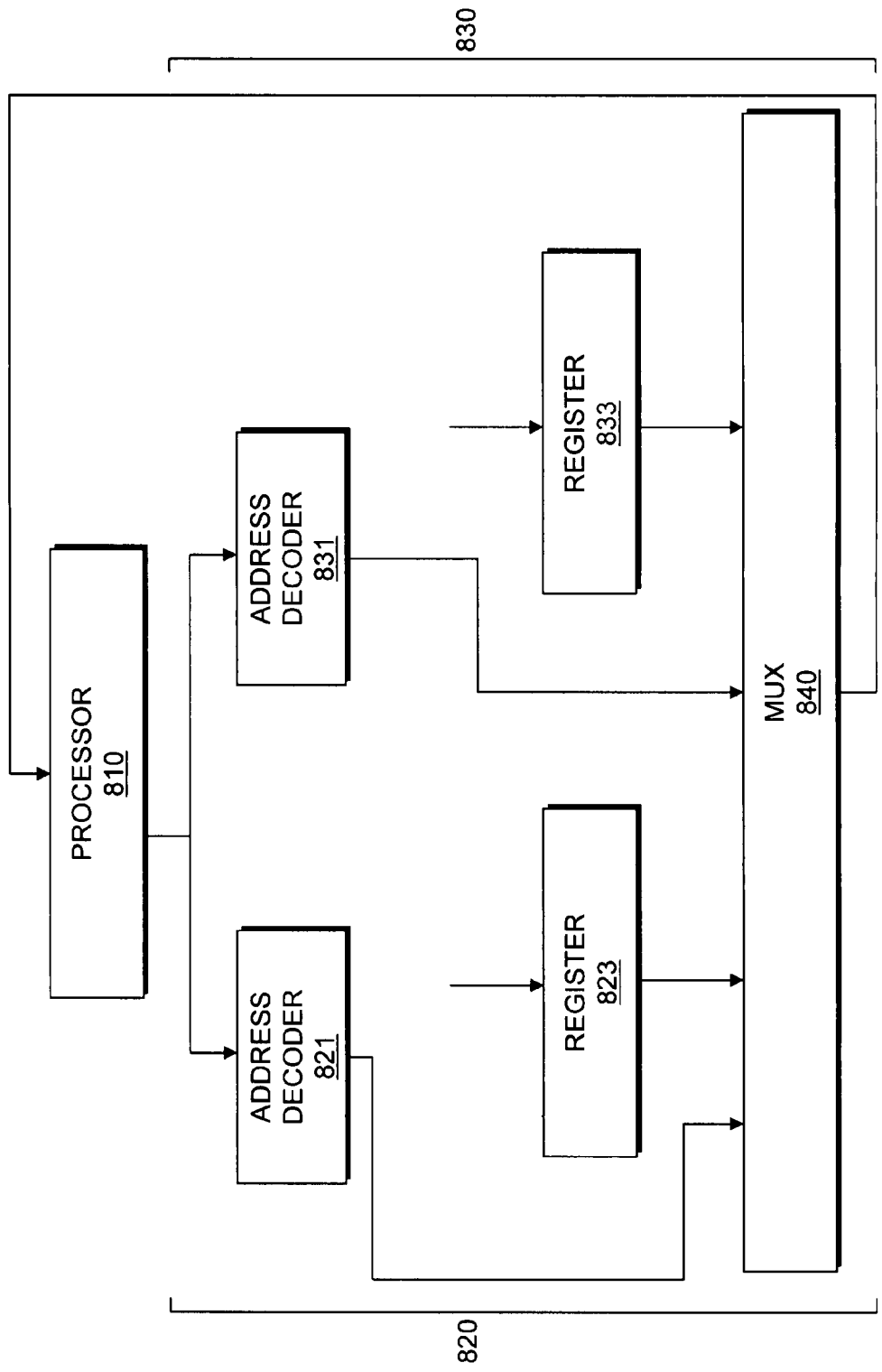
FIG. 8 illustrates circuitry generated for a processor interface block according to a second embodiment of the present invention.

FIG. 8 illustrates circuitry generated for a processor interface block according to a second embodiment of the present invention. A first group of circuitry 820 is generated for a first processor interface block and a second group of circuitry 830 is generated for a second processor interface block. According to an embodiment of the present invention, the circuitry for a processor interface block is generated for a system design when a designer selects a processor interface block from a library unit to include a block based schematic. The circuitry for the first processor interface block 820 and the circuitry for the second processor interface block 830 receive data from a component on a target device and is read by the processor 810. The circuitry for the first processor interface block 820 includes an address decoder 821 that determines whether an address received from the processor 810 (read address) matches an address for its associated register 823. The circuitry for the first processor interface block 820 includes a register 822 that stores data from a component on the target device. The circuitry for the second processor interface block 830 similarly includes an address decoder 831, and a register 832 which performs similarly to the circuitry for the first processor interface block 820. A data selector 840 receives a copy of the data from each of the registers 822 and 832 and selects data to be output in response to the address transmitted by the processor 810.

Figure 9:
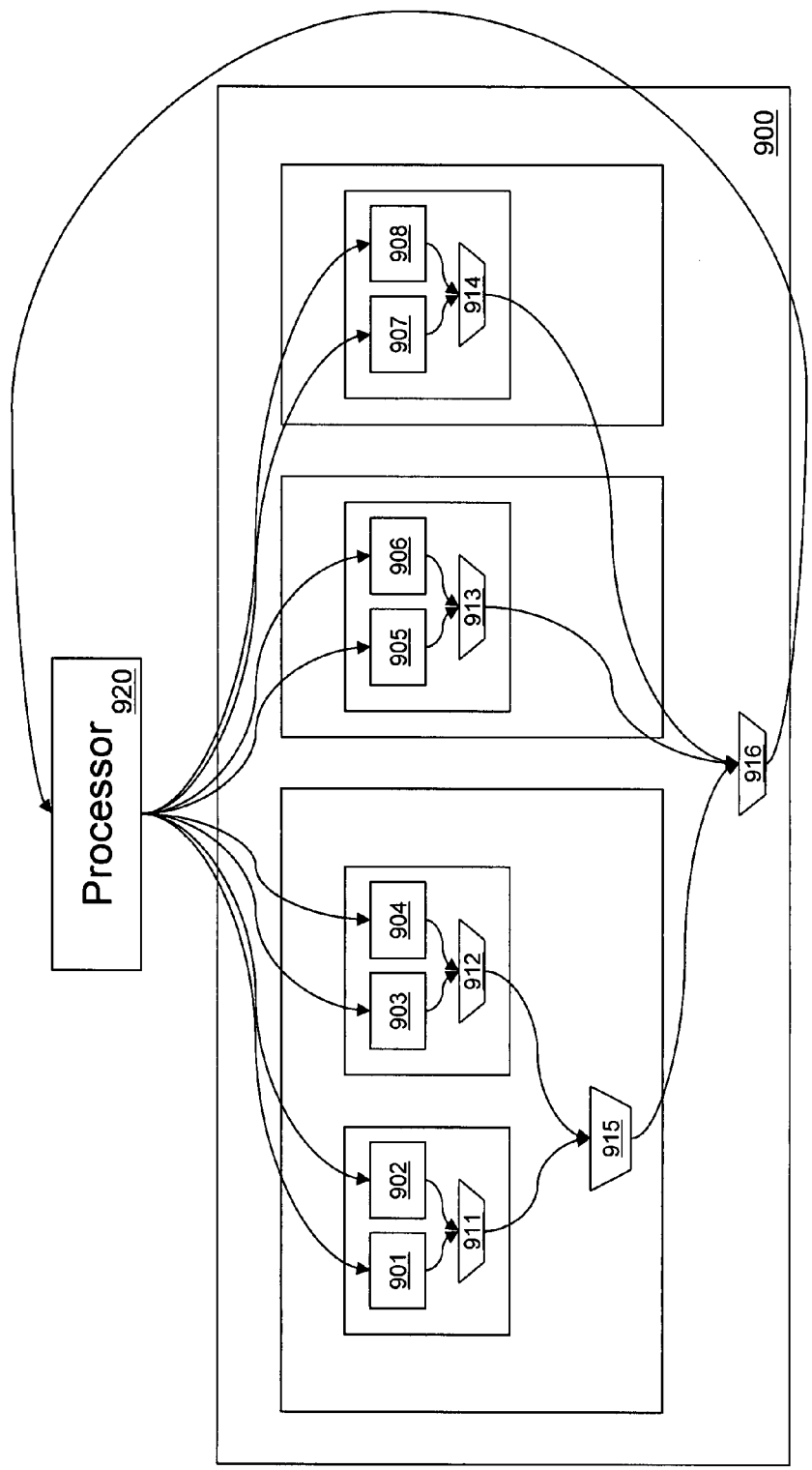
FIG. 9 illustrates a data selector according to an exemplary embodiment of the present invention.

FIG. 9 illustrates data selectors in a network of processor interface blocks 900 according to an exemplary embodiment of the present invention. The network of processor interface blocks 900 include a plurality of registers 901-908 each associated with a process interface block. A data selector that selects data stored in the registers 901-908 is illustrated. According to an embodiment of the present invention, the data selector includes a network of multiplexers 911-916. Each of the multiplexer selects an appropriate register value in response to an address generated by the processor 920. Although examples of a set number of registers and multiplexers are illustrated with respect to FIGS. 7-9, it should be appreciated that any number of registers and multiplexers may be implemented by the processor interface blocks. As shown, a hierarchical address decode structure may be created. In one embodiment, a separate clock can be used for a processor interface block to allow a slower clock to be used to aid timing closure.

Figure 10A:
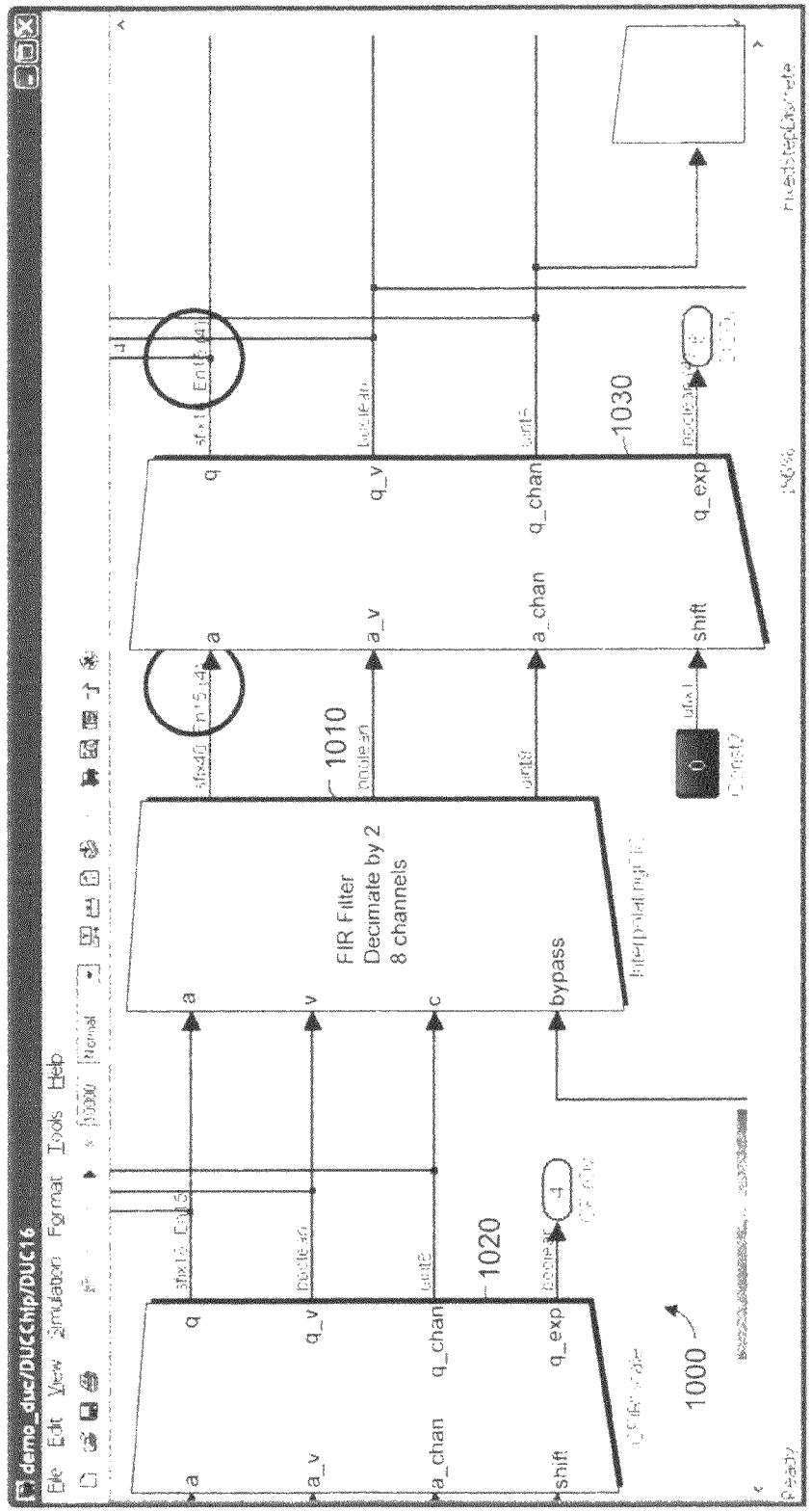
FIG. 10a illustrates a block based schematic that includes a parameterizable filter block according to an exemplary embodiment of the present invention.

FIG. 10a illustrates a block based schematic 1000 that includes a parameterizable filter block 1010 according to an exemplary embodiment of the present invention. The parameterizable filter block 1010 includes functionalities that may be programmed or changed before they are created. The block based schematic 1000 is shown as a screen shot on a graphical user interface 1001. According to an embodiment of the present invention, the block based schematic 1000 may be created using a graphical user interface unit such as the one illustrated in FIG. 3. In this example, the parameterizable filter block 1010 is a FIR filter that supports 8 channels and that decimates data by a factor of 2. The parameterizable filter block 1010 is connected to a first scale block 1020 and a second scale block 1030 which may also be implemented using programmable IP blocks. According to an embodiment of the present invention, each of the first and second scale blocks 1020 and 1030 operates to perform full precision rounding operations. As shown, because the parameterizable filter block 1010 decimates data from 8 channels using a scale of 2, the output of the parameterizable filter block 1010 utilizes a connection with 4 channels and the second scale block 1030 is configured to process the 4 channels and also utilizes an output connection with 4 channels.

Figure 10B:
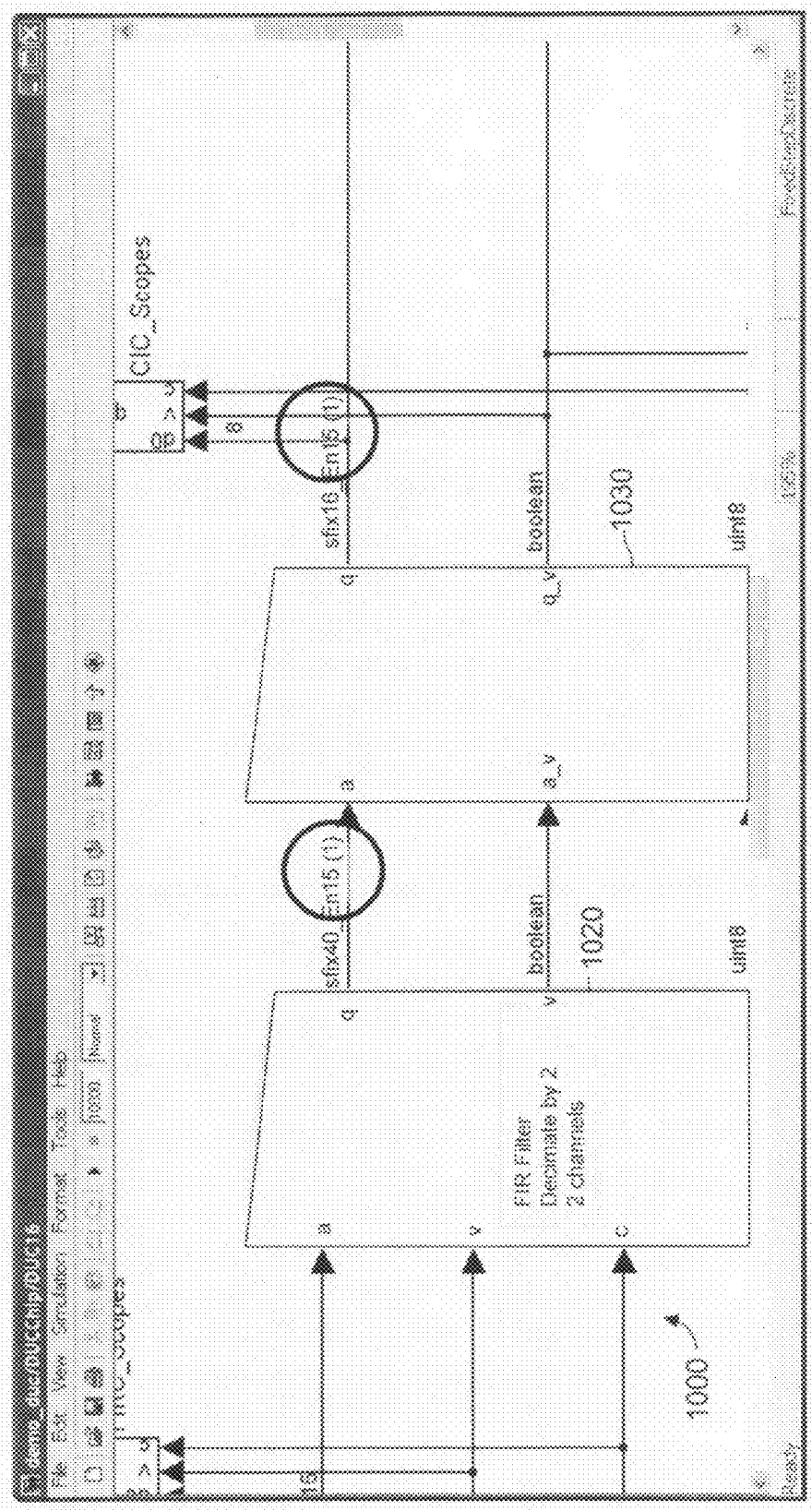
FIG. 10b illustrates a block based schematic with modifications based upon a change made to a parameterizable filter block.

FIG. 10b illustrates a block based schematic with modifications based upon a change made to a parameterizable filter block. In this example, the parameterizable filter block 1010 is a FIR filter that is modified to support 2 channels and that decimates data by a scale of 2. According to an embodiment of the present invention, the modification may be made by a designer using a graphical user interface unit such as graphical user interface unit 300 shown in FIG. 3. As a result of the modification, the graphical user interface automatically adjusts the design and reflects the adjustment on the block based schematic. As shown, the output of the parameterizable filter block 1010 now utilizes a connection with 1 channel and the second scale block 1030 is now configured to process the 1 channel and also utilizes an output connection with 1 channel.

It should be appreciated that a designer may make other changes to the parameterizable filter block such as changing its interpolation rate, decimation rate, clock rate of operation, and other parameters of the parameterizable filter block. A design adjustment unit of the graphical user interface unit operates to automatically modify the design without requiring the designer to input any additional information. The modification of the design may include modifying the capacity of connections between components in the design and modifying the processing capacity of components in the design by either cascading additional resources or removing unused resources inside the components to support the change to the parameterizable filter block. By automatically modifying the connections and resources of the system design, the design adjustment unit significantly reduces the time required from a designer.

Figure 11:
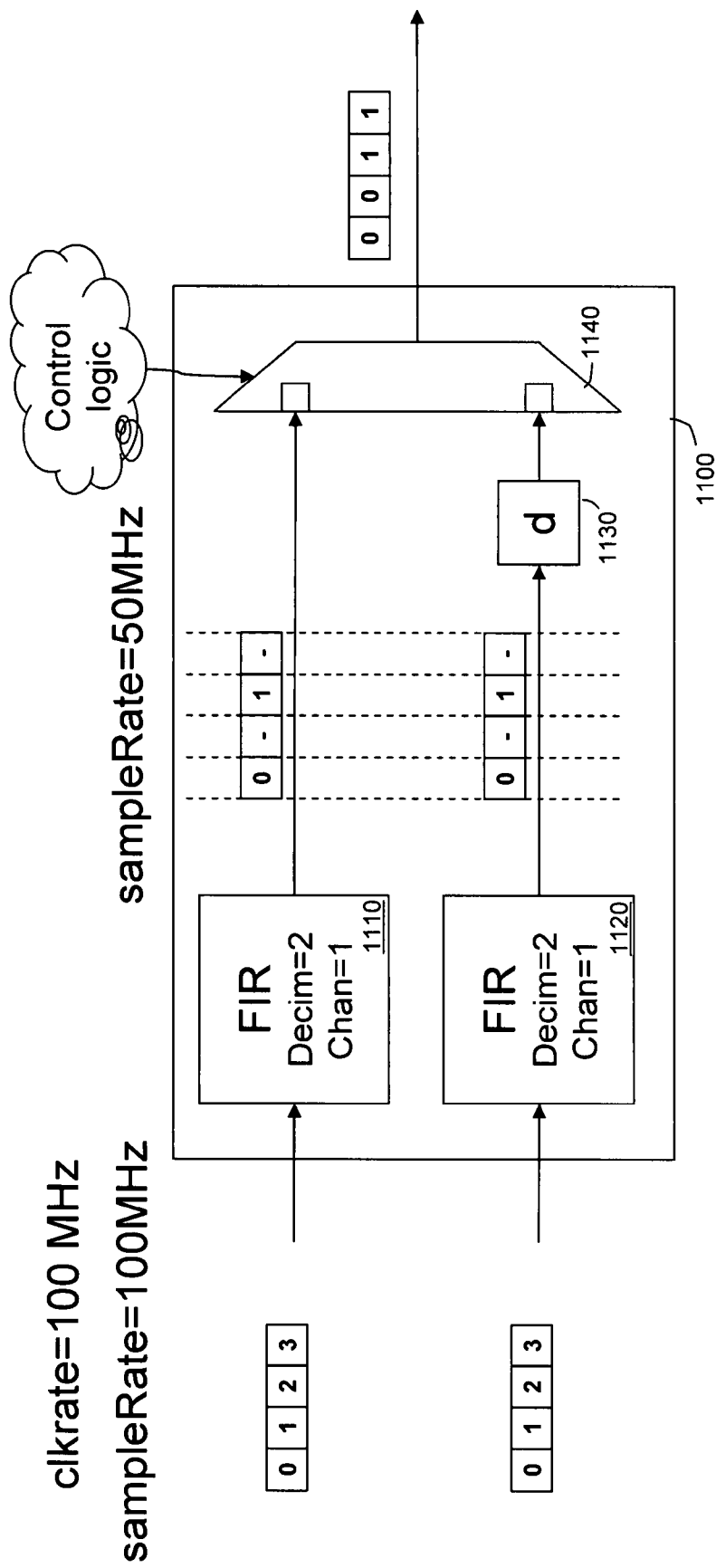
FIG. 11 illustrates a parameterizable filter block according to an exemplary embodiment of the present invention.

FIG. 11 illustrates a parameterizable filter block 1100 according to an exemplary embodiment of the present invention. According to an embodiment of the present invention, the parameterizable filter block 1100 supports the processing of a plurality of channels where the cumulative sample rate of the channels is greater than or equal to a clock rate of the system. By selecting the parameterizable filter block 1100 from a library unit, an intermediate representation generator from a graphical user interface unit generates an intermediate representation of the parameterizable filter block 1100 that may include sub-filters 1110 and 1120 for each input channel, delay elements, and control logic for multiplexing multiple channels into a single channel. As shown in FIG. 11, embodiments of the present invention allow vectorization of a filter in a parameterizable filter block. In this example, a parameterizable filter block 1100 is selected for a target device having a clock rate of 100 MHz. The sample rate of each channel being input to the parameterizable filter block 1100 is 100 MHz. The parameterizable filter block 1100 is generated to include a plurality of sub-filters 1110 and 1120 to support each channel input to the parameterizable filter block 1100. Decimation with a scale of 2 applies the sample rate of each output channel to be at 50 MHz. A delay element 1130 is connected to one of the sub-filters 1120 and control logic 1140 is used to multiplex the output of the sub-filters 1110 and 1120 onto a single wire. It should be appreciated that the intermediate representation generator may generate an intermediate representation of other types of parameterizable filter blocks having other numbers of input channels, other decimation, interpolation rates, clock, and sample rates, and being output onto other numbers of channels.

According to an embodiment of the present invention, if an aggregate sample rate (sample rate/channel*number of channels) is greater than a system clock frequency, a parameterizable filter block may allow multiple inputs in parallel and build multiple cores (sub-filters) internally. The connections between blocks in the block based schematic may include a "fat" wire representing a plurality of wires. This allows a block diagram to be scalable in channel count. In an embodiment where data rate for a single channel is higher than the clock frequency, then the parameterizable filter block may pass data over multiple wires, and use parallel dataflow internal to the parameterizable filter block.

Referring back to FIG. 2, the high level mapping unit 220 may identify one or more components in the intermediate description of the system and represents the one or more components in the description with one or more components on the target device that is capable of implementing the functionalities of the one or more components in the intermediate description of the system efficiently, wherein the component is uniquely available to the target device.

Figure 12:
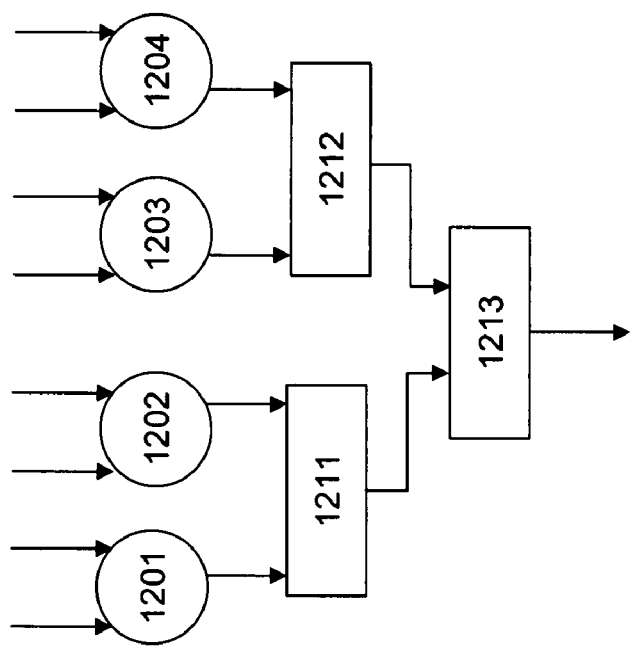
FIG. 12 illustrates a first set of components identified by a high level mapping unit according to an embodiment of the present invention.

FIG. 12 illustrates a first set of components identified by a high level mapping unit according to an embodiment of the present invention. The identified components include a plurality of multipliers 1201-1204 and a plurality of adders 1211-1213 that make up an adder tree. According to an embodiment of the present invention, a high level mapping unit determines that the plurality of multipliers 1201-1204 and the plurality of adders 1211-1213 should be implemented using a single DSP block available in a selected target device instead of implementing the plurality of multipliers 1201-1204 and the plurality of adders 1211-1213 with multipliers and adders in the selected target device.

Figure 13:
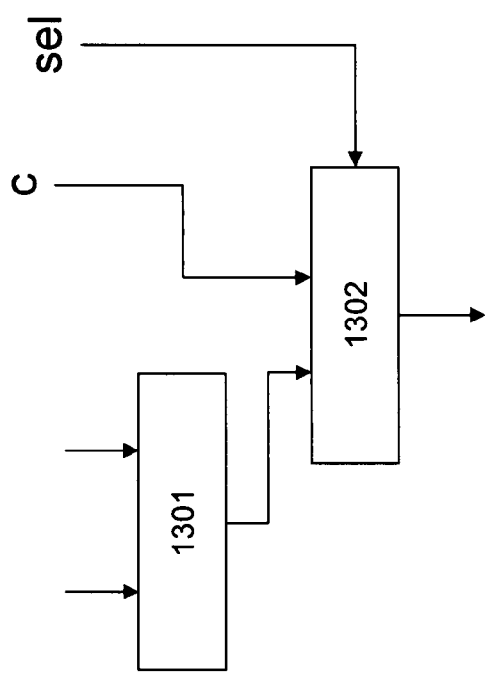
FIG. 13 illustrates a second set of components identified by a high level mapping unit according to an embodiment of the present invention.

FIG. 13 illustrates a second set of components identified by a high level mapping unit according to an embodiment of the present invention. The identified components include an adder 1301 and multiplexer 1302. According to an embodiment of the present invention, a high level mapping unit determines that the adder 1301 and multiplexer 1302 should be implemented using a single component Add_SLoad available in a selected target device instead of having to implement the adder 1301 and multiplexer 1302 with an adder and multiplexer in the selected target device.

Referring back to FIG. 2, it should be appreciated that the high level mapping unit 220 may perform other transformations. For example, the high level mapping unit 220 may determine that algorithmic delays or pipelined delays should be implemented using a specific resource on the target device such as LUTs or other specific memory resources available. The high level mapping unit 220 may determine that a multiplier in the intermediate description of the system should be implemented using a hard multiplier available and already configured on the target device rather than a soft multiplier requiring configuration from LUTs on the target device. The high level mapping unit 220 may determine that a multiplier in the intermediate description of the system should be coupled to a register if the register is required to allow timing in the system to be satisfied on the target device. It should be appreciated that other types of transformations may also be made based on the properties and characteristics of the target devices and the resources available on the target device.

FIG. 14a illustrates an exemplary full data path through components on a target device. At clock cycle (cc)=2, a first N bit number and second N bit number are output from a first memory component 1410 to a first adder 1420. The first adder 1420 is an N bit adder implemented using a single component. At cc=3, the first adder 1420 outputs a first M bit number to a second adder 1430. The output of the first adder 1420 is the sum of the first and second N bit numbers. The second adder 1430 is an M bit adder implemented using a single component. The second adder 1430 adds the first M bit number with a second M bit number. The second M bit number may be a constant or a number received from another source. At cc=4, the second adder 1430 outputs an L bit number to the second memory component 1440. The output of the second adder 1430 is the sum of the first and second M bit numbers. The length of an adder (carry chain) may influence the maximum frequency of a clock on a device. When an N bit adder is implemented using a single component, data may travel through N LUTs without being registered.

FIG. 14b illustrates an exemplary data path pipelined through components on a target device according to a first embodiment of the present invention. In this example, a high level mapping unit may determine that it is appropriate to implement the first and second adders 1420 and 1430 in FIG. 14a as partitioned adders. As shown, the first adder 1420 may be partitioned into three sub-adders 1421-1423. Each of the sub-adders 1421-1423 may be N/P bit adders, where N is the number of bits of adder 1420 and P is the total number of partitions. Each of the sub-adders includes registers. At cc=2, sub-adder 1421 receives a first portion of bits (the least significant bits) from the first N bit number and second N bit number from the first memory component 1410. Also during cc=2, a second portion of bits (the next significant bits) from the first N bit number and second N bit number are transmitted to a register 1451, and a third portion of bits (the most significant bits) from the first N bit number and the second N bit number are transmitted to a second register 1452. At cc=3, the sub-adder 1421 outputs the first N/P bits of the sum of the first portion of bits from the first N bit number and second N bit number to register 1453 and any carry bit to sub-adder 1422. Also during cc=3, the register 1451 transmits its values to sub-adder 1422, and register 1452 transmits its values to register 1454. At cc=4, register 1453 transmits its value to register 1455. Also at cc=4, sub-adder 1422 outputs the first N/P bits of the sum of the second portion of bits from the first N bit number and second N bit number and any carry bit from sub adder 1421 to register 1456. The sub-adder 1422 also transmits any carry bit to sub-adder 1423. Also at cc=4, register 1454 transmits its values to the sub-adder 1423.

As shown, the second adder 1430 may be partitioned into three sub-adders 1431-1433. Each of the sub-adders 1431-1433 may be M/P bit adders, where M is the number of bits of adder 1430 and P is the total number of partitions. Each of the sub-adders includes registers. At cc=5, sub-adder 1431 receives the value from register 1455 and a first portion of bits (the least significant bits) from the second M bit number. Also during cc=5, register 1461 receives the value from register 1456 and a second portion of bits (the next significant bits) from the second M bit number. Register 1462 receives the value summed from adder 1423 and a third portion of bits (the most significant bits) from the second M bit number. At cc=6, the sub-adder 1431 outputs the first M/P bits of the sum of the value from register 1455 and the first portion of bits from the first M bit number to register 1463. Sub-adder 1431 also outputs any carry bit to sub-adder 1432. Also during cc=6, the register 1461 transmits its values to sub-adder 1432. Register 1462 transmits its values to register 1464. At cc=7, register 1463 transmits its value to register 1465. Also at cc=7, sub-adder 1432 outputs the first M/P bits of the sum of the bits from register 1456 and the second portion of bits from the second M bit number to register 1466. The sub-adder 1432 also transmits any carry bit to sub-adder 1433. Also at cc=7, register 1464 transmits its values to the sub-adder 1433. At cc=8, register 1465 transmits its value to memory 1440, register 1466 transmits its value to memory 1440, and sub-adder 1433 outputs the sum of the bits from adder 1423 and the third portion of bits from the second M bit number to memory 1440.

As shown in FIG. 14b, registers 1451-1456 are required to buffer data between memory 1410 and the sub-adders 1422-1423, and registers 1461-1466 are required to buffer data between sub-adders 1431-1432 and memory 1440. Partitioning the adders 1420 and 1430 into sub-adders 1421-1423 and 1431-1433 which are capable of registering intermediate results allow the maximum frequency of the clock of the system to be increased.

Figure 15B:
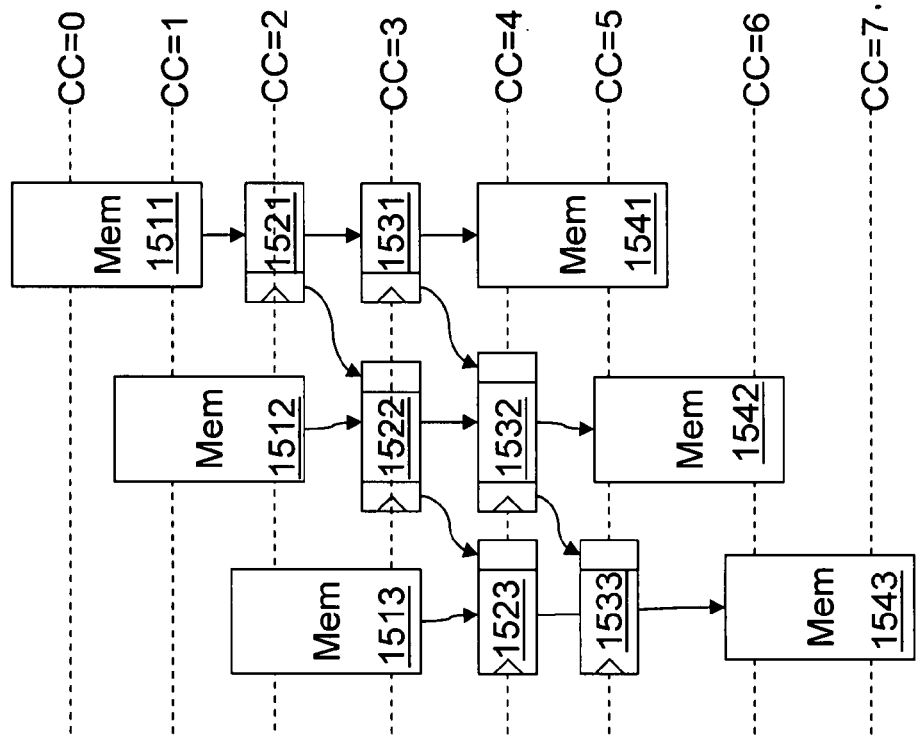
FIG. 15b illustrates an exemplary data path pipelined through components on a target device according to a second embodiment of the present invention.
Figure 15A:
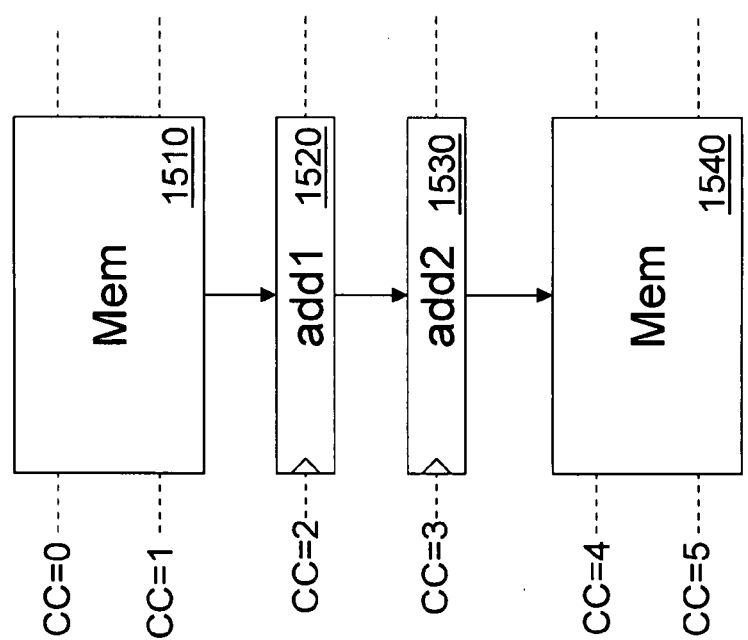
FIG. 15a illustrates an exemplary full data path through components on a target device.

FIGS. 15a and 15b illustrate an example of alternate configuration that may be used to partition adders according to an embodiment of the present invention. FIG. 15a illustrates an exemplary full data path through components on a target device such as the one illustrated in FIG. 14a. At clock cycle (cc)=2, a first N bit number and second N bit number are output from a first memory component 1510 to a first adder 1520. The first adder 1520 is an N bit adder implemented using a single component. At cc=3, the first adder 1520 outputs a first M bit number to a second adder 1530. The output of the first adder 1520 is the sum of the first and second N bit numbers. The second adder 1530 is an M bit adder implemented using a single component. The second adder 1530 adds the first M bit number with a second M bit number. The second M bit number may be a constant or a number received from another source. At cc=4, the second adder 1530 outputs an L bit number to the second memory component 1540. The output of the second adder 1530 is the sum of the first and second M bit numbers. The length of an adder (carry chain) may influence the maximum frequency of a clock on a device. When an N bit adder is implemented using a single component, data may travel through N LUTs without being registered.

FIG. 15b illustrates an exemplary data path pipelined through components on a target device according to a second embodiment of the present invention. In this example, a high level mapping unit may determine that it is appropriate to implement the first and second adders 1520 and 1530 in FIG. 15a as partitioned adders. As shown, the first adder 1520 may be partitioned into three sub-adders 1521-1523. Each of the sub-adders 1521-1523 may be N/P bit adders, where N is the number of bits of adder 1520 and P is the total number of partitions. The second adder 1530 may be partitioned into three sub-adders 1531-1533. Each of the sub-adders 1531-1533 may be M/P bit adders, where M is the number of bits of adder 1530 and P is the total number of partitions. Each of the sub-adders includes registers. As shown, the first memory component 1510 may be implemented using three separate sub-memory components 1511-1513 to store portions of bits from the first N bit number and the second N bit number. The second memory component 1540 may be implemented using three separate sub-memory components 1541-1543 to store results from sub-adders 1531-1533. Each of the sub-memory components 1511-1513, and 1541-1543 may be smaller or narrower memories or memories having the same size as memory components 1510 and 1540.

By using separate sub-memory components 1511-1513 to store portions of bits from the first and second N bit numbers, the portions of bits may be transmitted at different times or clock cycles, allowing data to be transmitted to the sub-adders 1521-1523 directly without using registers to buffer the data. In this example, sub-memory component 1511 stores a first portion of bits (the least significant bits) from the first and second N bit numbers, sub-memory component 1512 stores a second portion of bits (the next significant bits) from the first and second N bit numbers, and sub-memory component 1513 stores a third portion of bits (the most significant bits) from the first and second N bit numbers. By using separate sub-memory components 1541-1543 to store results from sub-adders 1531-1533, the results may be transmitted at different times or clock cycles, allowing data to be transmitted from the sub-adders 1531-1533 directly to the sub-memory components 1541-1543 without using registers to buffer the data.

At cc=2, sub-adder 1521 receives a first portion of bits from the first N bit number and second N bit number from the sub-memory component 1511. At cc=3, the sub-adder 1521 outputs the first N/P bits of its results to sub-adder 1531 and any carry bit to sub-adder 1522. The sub-adder 1531 also receives a first portion of bits from the second M bit number. Also at cc=3, a second portion of bits from the first N bit number and second N bit number are transmitted to sub-adder 1522. At cc=4, the first M/P bits of the results from sub-adder 1531 are transmitted to sub-memory component 1541 and any carry bit from sub-adder 1531 is transmitted to sub-adder 1532. Also at cc=4, the first N/P bits of the results from sub-adder 1522 are transmitted to sub-' adder 1532 and any carry bit from sub-adder 1522 is transmitted to sub-adder 1523. The sub-adder 1532 also receives a second portion of bits from the second M bit number. Also at cc=4, the sub-adder 1523 receives a third portion of bits from the first N bit number and second N bit number are transmitted to sub-adder 1523. At cc=5, the first M/P bits of the results from sub-adder 1532 are transmitted into sub-memory component 1542 and any carry bit from sub-adder 1532 is transmitted to sub-adder 1533. Also at cc=5, the result from sub-adder 1523 is transmitted to sub-adder 1533. The sub-adder 1533 also receives a third portion of bits from the second M bit number. At cc=6, the results of sub-adder 1533 are transmitted to sub-memory component 1543.

As shown in FIG. 15*b*, by partitioning the first and second memory components 1510 and 1540, additional registers are not required to buffer data between memory components 1511-1513 and sub-adders 1521-1523, and additional registers are not required to buffer data between sub-adders 1531-1532 and sub-memory components 1541-1543. By directly transmitting results from sub-adder 1521 to sub-adder 1531, sub-adder 1522 to sub-adder 1532, and sub-adder 1523 to sub-adder 1533, adjacent adders are allowed to tessellate in time so that registers are not required to buffer data between the adders. Partitioning the adders 1520 and 1530 into sub-adders 1521-1523 and 1531-1533 which are capable of registering intermediate results allow the maximum frequency of the clock of the system to be increased.

Figure 16:
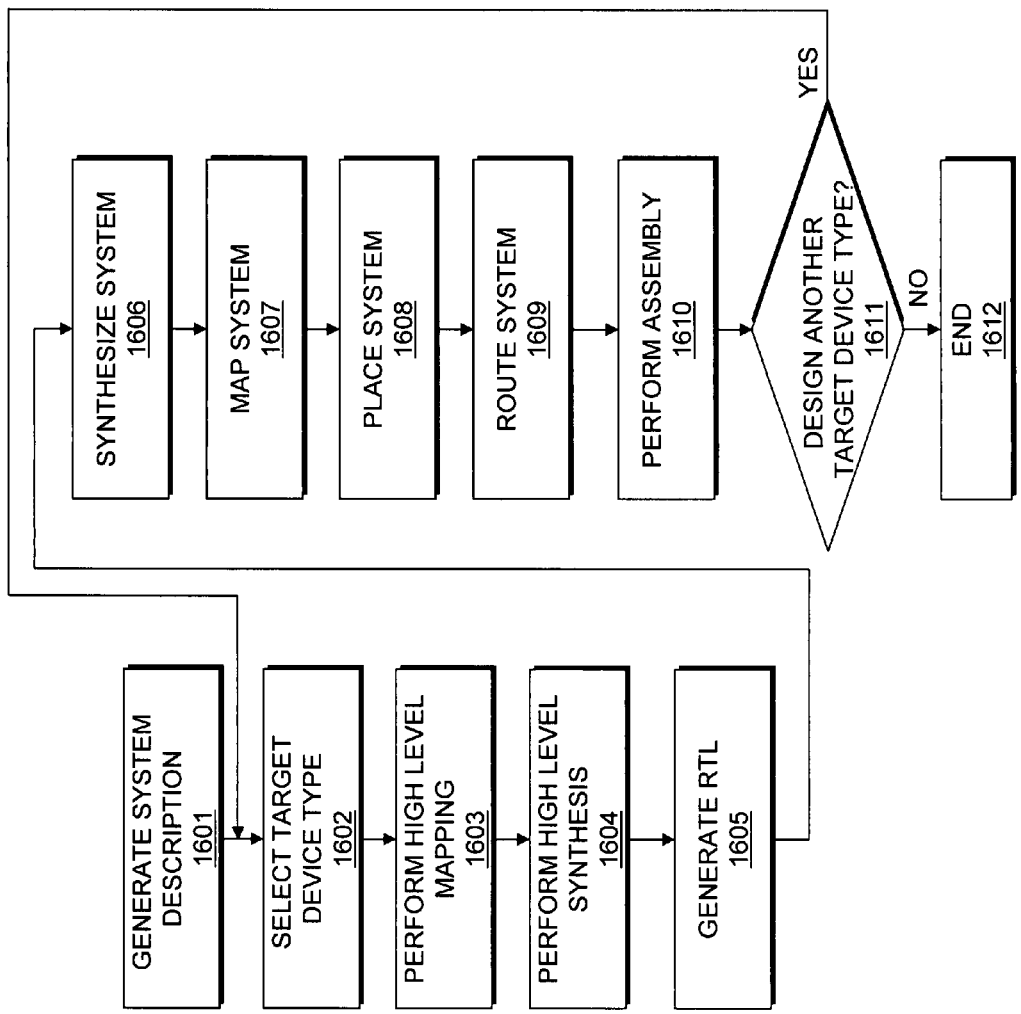
FIG. 16 is a flow chart illustrating a method for designing a system on target devices according to an exemplary embodiment of the present invention.

FIG. 16 is a flow chart illustrating a method for designing a system on a target device according to an embodiment of the present invention. The procedure shown in FIG. 1 may be performed by an EDA tool such as a system designer implemented on a computer system. At 1601, a description of the system is generated. According to an embodiment of the present invention, an initial description of the system may be provided by a designer. A structural netlist may be generated from an initial description provided by the design in a programming language construct. Alternatively, a structural netlist may be generated from an initial description provided by the designer in a block based schematic created from a graphical user interface tool. The graphical user interface tool may include a library of functional units that may be selected and connected together to form the block based schematic. The structural netlist describes the components and connectivity of the system.

It should be appreciated that the designer may provide a description of the system at a level of detail that does not include pipelined delays that may be implemented by registers or other delay components that allow the system to satisfy timing requirements such as operating at or above a maximum frequency of a clock for the system specified by a designer. This allows the designer to provide a description that may be applicable to more than one target devices as opposed to a description suited for a specific target device. The structural netlist functions as an intermediate representation of the description of the system.

At 1602, a target device is selected. According to an embodiment of the present invention, the target device is selected or specified by a designer. The target device may be, for example, one of the specific FPGAs previously listed or an FPGA having a different architecture.

At 1603, high level mapping is performed on the intermediate representation of the description of the system. According to one aspect of high level mapping, based on the target device selected by the designer one or more components in the intermediate representation of the description of the system may be identified and represented with a component on the target device that is capable of implementing the functionalities of the one or more components efficiently.

According to a second aspect of high level mapping, timing analysis is performed to determine whether a data path through an adder satisfies a timing requirement of the system. If the data path is a critical path and does not satisfy a timing requirement of the system, it may be determined that it would be beneficial to implement the adder with a partitioned adder that utilize a plurality of sub-adders rather than implementing the adder as a single component. Partitioning an adder allows intermediate results generated from sub-adders to be registered. This allows the maximum frequency of a clock on the target device may be increased to meet the timing requirement. Timing analysis may be performed to determine how an adder should be partitioned and how many partitions should be made. A partitioning procedure may be performed to identify components on the target device to support and implement the adder as a partitioned adder having a plurality of sub-adders. According to an embodiment of the present invention, a separate sub-adder may be designated for each partition of an adder, a separate memory to input data into each sub-adder, and/or a separate memory to receive data from each sub-adder. Each sub-adder may add together a first portion of two N bit numbers and provide a carry value to the input of a next sub-adder that adds together a second portion of the two N bit numbers. According to an embodiment of the high level technology mapping unit, the number of logic elements used for implementing a partitioned adder is P*N+P, where P is a number of partitions in an adder and N is a number of bits of the adder.

At 1604, high level synthesis is performed on the intermediate representation of the description of the system. According to an embodiment of the present invention, based on the target device selected by the designer, pipelined delays are added to the intermediate representation of the system to allow the system to satisfy timing requirements such as operating at or above the maximum frequency of the clock. The pipelined delays may be implemented using registers and/or other delay components. Each target device may have a unique architecture with resources having unique properties that may require a different number or configuration of delay components in the design to make the system operate efficiently.

According to an embodiment of the present invention, a bit-accurate, cycle-accurate simulation model may be generated from the intermediate representation of the system. The intermediate representation of the system may be used to compute the number of LUTs, multipliers, and memories used in each functional unit to provide feedback to a designer.

At 1605, a register transfer language (RTL) representation of the system is generated from the intermediate representation of the description of the system. The RTL representation may be in a hardware description languages such as Verilog or very-high-speed integrated circuit (VHSIC) hardware description language (VHDL).

At 1606, synthesis is performed on the system design. According to an embodiment of the present invention, synthesis generates an optimized logical representation of the system from a HDL design definition. The optimized logical representation of the system may include a representation that has a minimized number of functional blocks such as logic gates, logic elements, and registers required for the system.

At 1607, technology mapping is performed on the optimized logic design. Technology mapping includes determining how to implement logic gates and logic elements in the optimized logic representation with resources available on the target device. The resources available on the target device may be referred to as "cells" or "components" and may include logic-array blocks, registers, memories, digital signal processing blocks, input output elements, and other components. According to an embodiment of the present invention, an optimized technology-mapped netlist generated from the HDL.

At 1608, the mapped logical system design is placed. Placement works on the optimized technology-mapped netlist to produce a placement for each of the functional blocks. According to an embodiment of the present invention, placement includes fitting the system on the target device by determining which resources available on the target device are to be used for specific function blocks in the optimized technology-mapped netlist. According to an embodiment of the present invention, placement may include clustering which involves grouping logic elements together to form the logic clusters present on the target device.

At 1609, it is determined which routing resources should be used to connect the components in the target device implementing the functional blocks of the system. During routing, routing resources on the target device are allocated to provide interconnections between logic gates, logic elements, and other components on the target device. The routing procedure may be performed by a router in an EDA tool that utilizes routing algorithms.

At 1610, an assembly procedure is performed. The assembly procedure involves creating a data file that includes some of the information determined by the procedure described by 101-105. The data file may be a bit stream that may be used to program the target device. According to an embodiment of the present invention, the procedures illustrated in FIG. 1 may be performed by an EDA tool executed on a first computer system. The data file generated may be transmitted to a second computer system to allow the design of the system to be further processed. Alternatively, the data file may be transmitted to a second computer system which may be used to program the target device according to the system design. It should be appreciated that the design of the system may also be output in other forms such as on a display device or other medium.

At 1611, it is determined whether a design is to be generated for another target device. If it is determined that a design is to be generated for another target device type, control returns to 1602 where another target device type may be selected. If it is determined that a design is not to be generated for another target device type, control proceeds to 1612.

At 1612, control terminates the procedure.

Figure 17:
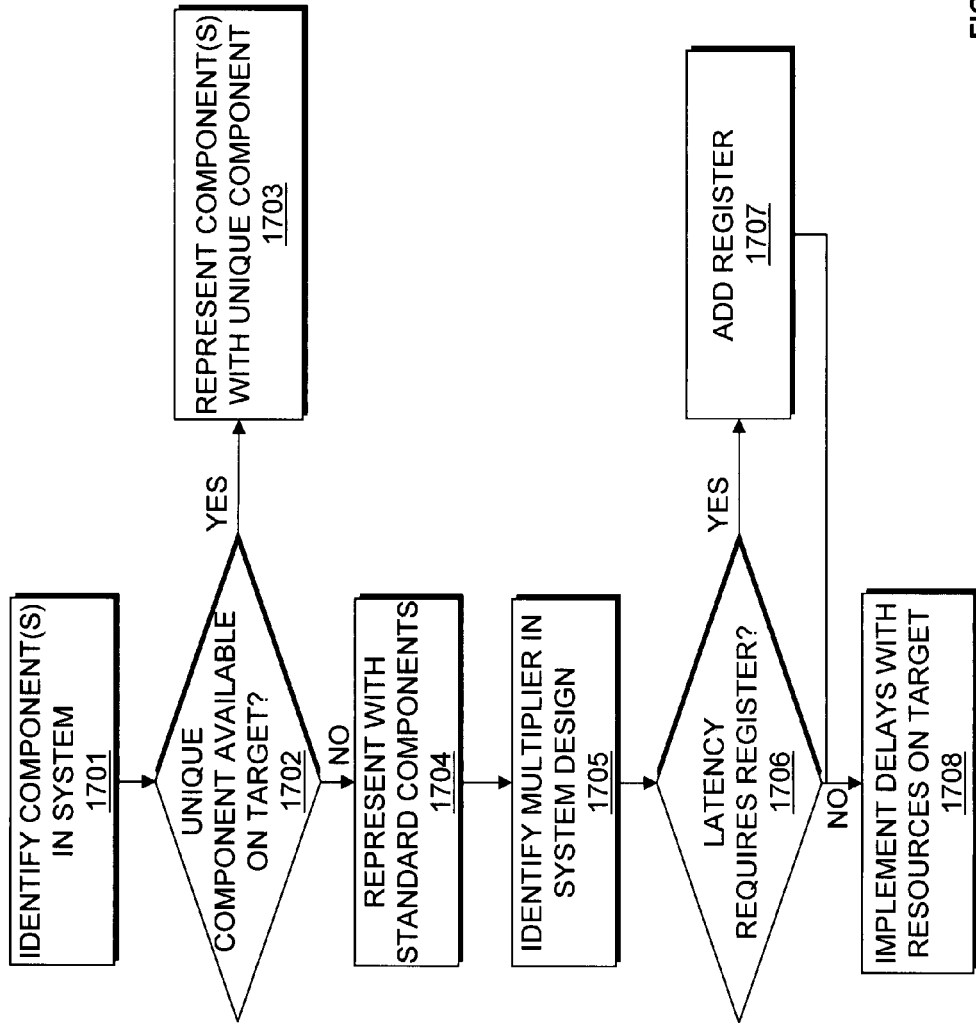
FIG. 17 is a flow chart illustrating a method for performing a first aspect of high level technology mapping according to an exemplary embodiment of the present invention.

FIG. 17 is a flow chart illustrating a method for performing a first aspect of high level mapping according to an exemplary embodiment of the present invention. The procedure illustrated in FIG. 17 may be implemented at 1603 shown in FIG. 16. At 1701, one or more components are identified in the intermediate representation of the system.

At 1702, it is determined whether a unique component or resource on a selected target device is available to implement the one or more components identified in the intermediate representation of the system. If a unique component or resource on the selected target device is available, control proceeds to 1703. If a unique component or resource is not available to implement the one or more components identified, control proceeds to 1704.

At 1703, the one or more components identified in the intermediate representation of the system is represented with the unique component. According to an embodiment of the present invention, with respect to procedures 1701-1703, the one or more components identified in the intermediate representation of the system may be a plurality of multipliers and an adder tree and the unique component on the selected target device may be a digital signal processing (DSP) block capable of implementing the plurality of multipliers and adder tree. The one or more components identified in the intermediate representation of the system may be an adder and multiplexer and the unique component on the selected target device may be an Add_SLoad component. The one or more components identified may be a multiplier and the unique component on the selected target device may be a hard multiplier. The hard multiplier may reside on a DSP block. It should be appreciated that other components in the system may be identified and implemented with unique components on the specified target device.

At 1704, the one or more components in the system is represented with standard components on the specified target device. For example, adders, multipliers, multiplexers, or a combinations of these components may be implemented using look up tables and other generic components that may be programmed to implement a variety functions.

At 1705, a multiplier in the system is identified.

At 1706, it is determined whether the latency of an output of the multiplier satisfies a timing requirement. If the latency of the multiplier does not satisfy the timing requirement control proceeds to 1707. If the latency of the multiplier satisfies the timing requirement, control proceeds to 1708.

At 1707, a register is added to the output of the multiplier.

At 1708, delays in the intermediate representation of the system are represented using resources available on the specified target devices.

Figure 18:
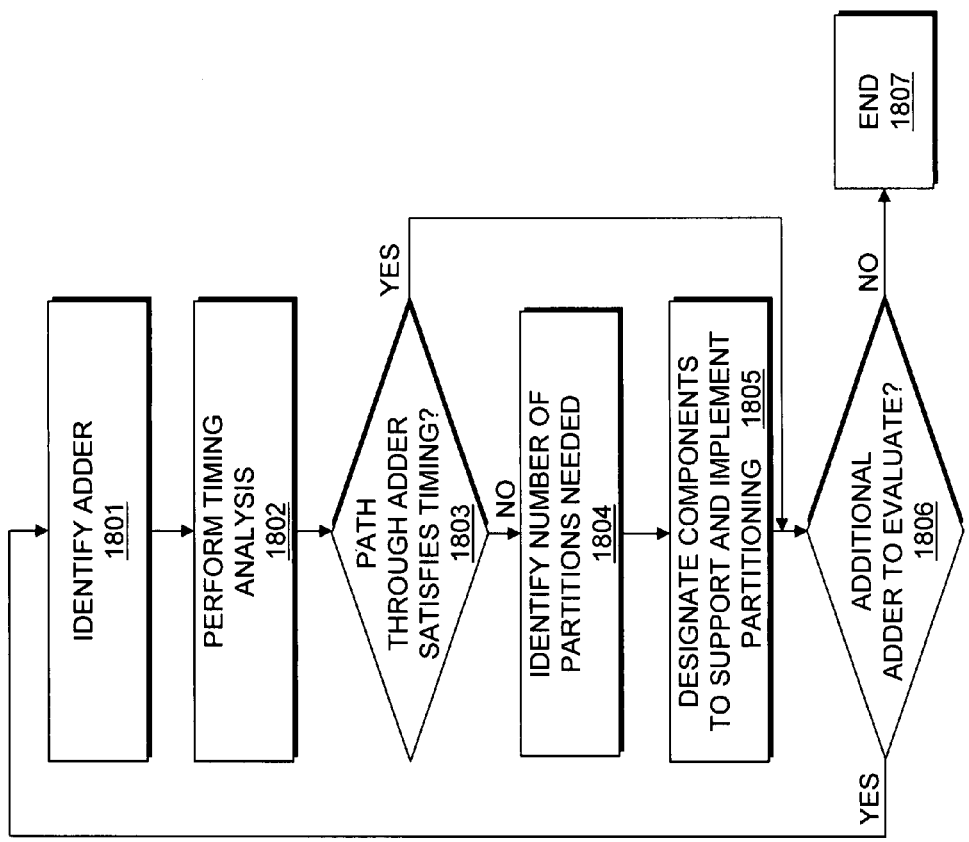
FIG. 18 is a flow chart illustrating a method for performing a second aspect of high level technology mapping according to an exemplary embodiment of the present invention.

FIG. 18 is a flow chart illustrating a method for performing a second aspect of high level technology mapping according to an exemplary embodiment of the present invention. At 1801 an adder is identified in the intermediate representation of the system. The adder may be one that is originally designated for being implemented as a single component. The single component may be a carry chain that does not register any intermediate values until the final result of the adder is computed.

At 1802, a timing analysis is performed. According to an embodiment of the present invention, timing analysis determines whether a data path through the adder satisfies a timing requirement of the system. The timing analysis is specific for the target device selected by the designer. The timing requirement of the system may be for example a maximum frequency of a clock for the system.

At 1803, it is determined whether the data path through the adder satisfies the timing requirement of the system. If the data path through the adder satisfies the timing requirement of the system, control proceeds to 1806. If the data path through the adder does not satisfy the timing requirement of the system, control proceeds to 1804.

At 1804, a number of partitions required for the adder is determined. The number of partitions required may be based upon the results of the timing analysis performed at 1802, the architectural layout and resources available on the target device, the timing requirement of the system, and/or other criteria.

At 1805, components for supporting and implementing the partitioning are designated. According to an embodiment of the present invention, a plurality of sub-adders may be designated for implementing an identified adder, sub-memory components may be designated for implementing a memory that transmits values to the sub-adders or that receives values from the sub-adders, and/or additional registers for buffering data.

At 1806, it is determined whether an additional adder exists to evaluate. If an additional adder exists to evaluate, control returns to 1801. If no additional adder exists to evaluate, control proceeds to 1807.

At 1807, control terminates the procedure.

Figure 19:
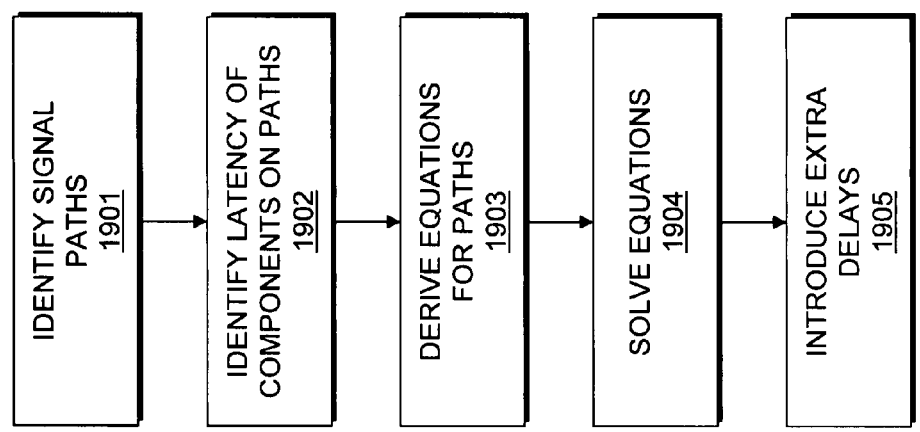
FIG. 19 is a flow chart illustrating a method for performing high level synthesis according to an exemplary embodiment of the present invention.

FIG. 19 is a flow chart illustrating a method for performing high level synthesis according to an embodiment of the present invention. At 1901, signal paths between a source (input) and destination (output) are identified.

At 1902, the latency of components along the signal path is identified.

At 1903, equations characterizing the delay along the signal paths are generated. According to an embodiment of the present invention, all related signals from the source arrive at the destination on the same clock cycle.

At 1904, the equations characterizing the delay along the signal paths are solved. According to an embodiment of the present invention, the equations are solved using integer linear programming where the delays along the signal paths are minimized.

At 1905, pipeline delay is added to signal paths having non-zero values.

Figure 20:
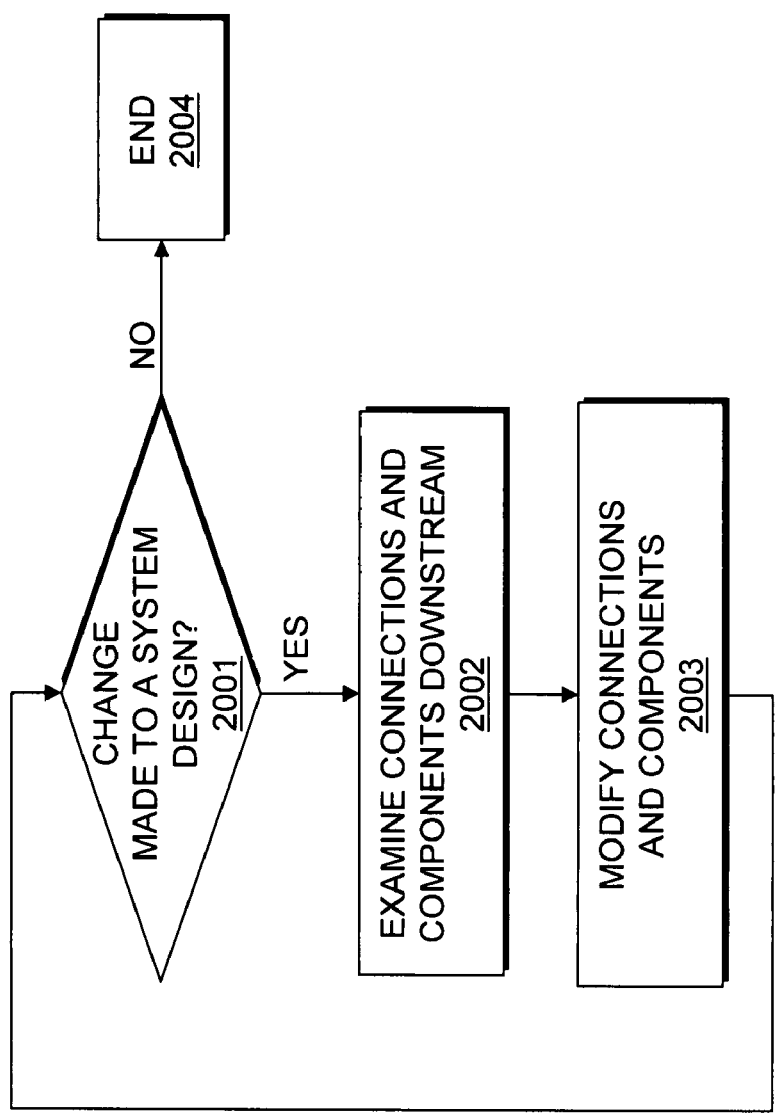
FIG. 20 is a flow chart illustrating a method for making modifications to a system design in response to changes made to a parameterizable filter block.

FIG. 20 is a flow chart illustrating a method for making modifications to a system design in response to changes made to a parameterizable filter block. The procedure illustrated in FIG. 20 may be performed at procedure 1601 shown in FIG. 16. At 2001, it is determined whether a change has been made to a system design. The change may pertain to a parameter of a parameterizable filter block such as an interpolation rate, decimation rate, number of channels supported, clock rate of operability, or other parameter. This change may be made during the creation of a block based schematic or after a block based schematic has been completed. If it is determined that a change has been made, control proceeds to 2002, if it is determined that a change has not been made, control proceeds to 2004.

At 2002, connections and components in the system design are examined to determine the impact of the change to the system design. It may be determined whether a capacity for the amount of data supportable by connections downstream from the parameterizable filter block is required to be modified or would additional circuitry to support the processing is required to be modified. For example, if a parameterizable filter block increases a number of channels it processes, the capacity for the data supported by the connections downstream from the parameterizable filter block should be increased.

At 2003, the appropriate connections and components identified at 2002 are modified. According to an embodiment of the present invention, the procedures at 2002 and 2003 are performed automatically without requiring the designer to perform any of the actual examining or modifying. In one embodiment, the modifications are made without modifying the structural representation or number of blocks or connections in the block based schematic representation of the system design. Instead, the modifications may be represented by text notation on existing blocks and/or connections in the block based schematic representation. Control returns to 2001.

At 2004, control terminates the procedure.

FIGS. 16 through 20 are flow charts illustrating methods according to embodiments of the present invention. The techniques illustrated in these figures may be performed sequentially, in parallel or in an order other than that which is described. The techniques may be also be performed one or more times. It should be appreciated that not all of the techniques described are required to be performed, that additional techniques may be added, and that some of the illustrated techniques may be substituted with other techniques.

Embodiments of the present invention may be provided as a computer program product, or software, that may include an article of manufacture on a machine accessible or machine readable medium having instructions. The instructions on the machine accessible or machine readable medium may be used to program a computer system or other electronic device. The machine-readable medium may include, but is not limited to, floppy diskettes, optical disks, CD-ROMs, and magneto-optical disks or other type of media/machine-readable medium suitable for storing electronic instructions. The techniques described herein are not limited to any particular software configuration. They may find applicability in any computing or processing environment. The terms "machine accessible medium" or "machine readable medium" used herein shall include any medium that is capable of storing, or encoding a sequence of instructions for execution by the machine and that cause the machine to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

In the foregoing specification embodiments of the invention has been described with reference to specific exemplary embodiments thereof. It will, however, be evident that various modifications and changes may be made thereto without departing from the broader spirit and scope of the embodiments of the invention. The specification and drawings are, accordingly, to be regarded in an illustrative rather than restrictive sense.

What is claimed is:

1. An electric design automation (EDA) tool for generating a design of a system on a target device, comprising:
    a graphical user interface to create a block based schematic;
    a library unit that includes a parameterizable filter block selectable by a designer to include in the block based schematic to represent a component in the design that filters data; and
    a design adjustment unit to automatically modify previously programmed and selected components and wires in the block based schematic without input from the designer upon determining a change made to the parameterizable filter block by the designer.

2. The EDA tool of claim 1, wherein the change made to the parameterizable filter block comprises changing an interpolation rate of the parameterizable filter block.

3. The EDA tool of claim 1, wherein the change made to the parameterizable filter block comprises changing a decimation rate of the parameterizable filter block.

4. The EDA tool of claim 1, wherein the change made to the parameterizable filter block comprises changing a number of channels supported by the parameterizable filter block.

5. The EDA tool of claim 1, wherein the change made to the parameterizable filter block comprises changing a clock rate of the parameterizable filter block.

6. The EDA tool of claim 1, wherein parameterizable filter block is a cascaded integrator-comb (CIC) filter.

7. The EDA tool of claim 1, wherein the parameterizable filter block is a finite infinite response (FIR) filter.

8. The EDA tool of claim 1, wherein the design adjustment unit modifies a selected wire to a new wire that supports a greater amount of data.

9. The EDA tool of claim 1, wherein the design adjustment unit modifies a selected wire to a new wire that supports a lesser amount of data.

10. The EDA tool of claim 1, wherein the design adjustment unit modifies a selected component by enabling the component to support processing of a greater amount of data.

11. The EDA tool of claim 1, wherein the design adjustment unit modifies a selected component by enabling the component to support processing of a lesser amount of data.

12. The EDA tool of claim 1, wherein the filter block supports a plurality of channels where a cumulative sample rate of the channels is greater than or equal to a clock rate of the system.

13. The EDA tool of claim 12, further comprising an intermediate representation generator to generate an intermediate representation of the system from the functional units selected from the library, wherein for each parameterizable filter block, a sub-filter is assigned to each channel.

14. The EDA tool of claim 1, further comprising an intermediate representation generator to generate an intermediate representation of the system from a description of the system that does not include any pipeline delays, the description of the system made up from functional units selected from the library.

15. The EDA tool of claim 1, further comprising a high level synthesis unit to generate a register transfer language (RTL) representation of the system to be implemented on a target device specified by the designer from an intermediate representation of the system, the RTL representation including pipelined delays to allow the system to satisfy a maximum frequency of a clock as implemented on the target device.

16. A method for designing a system to be implemented on a target device, comprising:
    providing a library of selectable functional units selectable by a designer to generate a block based schematic of a system to be implemented on a target device, the library of selectable functional units including a parameterizable filter block to represent a component in the design that filters data;
    determining whether a change has been made to the parameterizable filter block by the designer, and
    automatically modifying previously selected functional units and wires in the design without input from the designer upon determining the change, wherein one of the providing, determining, and modifying procedures is performed on a processor.

17. The method of claim 16, wherein determining whether a change is made comprises determining whether an interpolation rate of the parameterizable filter block has been changed.

18. The method of claim 16, wherein determining whether a change is made comprises determining whether a decimation rate of the parameterizable filter block has been changed.

19. The method of claim 16, wherein determining whether a change is made comprises determining whether a number of channels supported by the parameterizable filter block has been changed.

20. The method of claim 16, wherein determining whether a change is made comprises determining whether a clock rate of the parameterizable filter block has been changed.

21. The method of claim 16, wherein modifying comprises changing a selected wire to a new wire that supports greater amount of data.

22. The method of claim 16, wherein modifying comprises changing a selected component by enabling the component to support processing of a greater amount of data.

23. The method of claim 16, further comprising generating an intermediate representation of the system from the functional units selected from the library, wherein for each parameterizable filter block, a sub-filter is assigned to each channel.

24. The method of claim 16, further comprising generating an intermediate representation of the system from a description of the system that does not include any pipeline delays, the description of the system made up from functional units selected from the library.

25. A computer-readable medium having stored thereon sequences of instructions, the sequences of instructions including instructions which when executed by a computer causes the machine to perform:
    providing a library of selectable functional units selectable by a designer to generate a description of the system, the library of selectable functional units including a parameterizable filter block to represent a component in the design that filters data;
    determining whether a change is made to the parameterizable filter block by the designer; and
    automatically modifying previously selected functional units and wires in the design without input from the designer upon determining the change.

26. The computer-readable medium of claim 25, further comprising instructions which when executed causes the computer to further perform generating an intermediate representation of the system from the functional units selected from the library, wherein for each parameterizable filter block, a sub-filter is assigned to each channel.

27. The computer-readable medium of claim 25, further comprising instructions which when executed causes the computer to further perform generating an intermediate representation of the system from a description of the system that does not include any pipeline delays, the description of the system made up from functional units selected from the library.

28. An electric design automation (EDA) tool for generating a design of a system on a target device, comprising:

a library that includes a plurality of selectable functional units including a parameterizable filter block selectable by a designer to represent a component in the design that filters data, wherein the component supports a plurality of channels and a cumulative sample rate of the channels component is greater than or equal to a clock rate of the system.

29. The EDA tool of claim 28, further comprising an intermediate representation generator to generate an intermediate representation of the system from the functional units selected from the library, wherein for each parameterizable filter block, a sub-filter is assigned to each channel.

* * * * *